United States Patent [19]
Takao

[11] Patent Number: 5,773,996
[45] Date of Patent: Jun. 30, 1998

[54] MULTIPLE-VALUED LOGIC CIRCUIT

[75] Inventor: Waho Takao, Kanagawa, Japan

[73] Assignee: Nippon Telegraph and Telephone Corporation, Tokyo, Japan

[21] Appl. No.: 650,251

[22] Filed: May 22, 1996

[30] Foreign Application Priority Data

May 22, 1995 [JP] Japan .................................. 7-122889

[51] Int. Cl.$^6$ .................................................. H03K 17/70
[52] U.S. Cl. .......................... 326/135; 326/123; 326/134
[58] Field of Search ........................ 257/24, 25; 326/123, 326/132, 134, 135

[56] References Cited

U.S. PATENT DOCUMENTS

| | | | |
|---|---|---|---|
| 4,242,595 | 12/1980 | Lehovec .................................. | 326/132 |
| 5,313,117 | 5/1994 | Maezawa .................................. | 326/134 |
| 5,428,224 | 6/1995 | Hayashi et al. ............................ | 257/24 |
| 5,537,076 | 7/1996 | Fuji ........................................ | 326/135 |

FOREIGN PATENT DOCUMENTS

| | | |
|---|---|---|
| 0596691 A2 | 11/1993 | European Pat. Off. . |
| 0644480 A2 | 5/1994 | European Pat. Off. . |
| 01051718 A | 2/1989 | Japan . |
| 04286418 A | 10/1992 | Japan . |
| 07030130 A | 1/1995 | Japan . |
| 07193255 A | 7/1995 | Japan . |

OTHER PUBLICATIONS

Mayeda W., "Diode Circuit", IBM Technical Disclosure Bulletin, vol. 3, No. 10, Mar. 1961, p. 77.
Baskin, H. B., "N–Valued Logic Circuit", IBM Technical Disclosure Bulletin, vol. 3, No. 10, Mar. 1961, p. 81.
Akmenkalns, I. G., "Odd–Even Circuit", IBM Technical Disclosure Bulletin, vol. 4, No. 12, May 1962, p. 76.
Explanation of "Multiple–Valued ECL Quantization Circuit" T. Higuchi and M. Kameyama, Multiple–Valued Digital Processing System (Shokado, 1989) p. 77.
"Multivalued SRAM Cell Using Resonant Tunneling Diodes" by Sen–Jung Wei and Hung Chang Lin IEEE Journal of Solid–State Circuits. vol. 27, No. 2 Feb. 1992, pp. 212–216.
M. W. Dellow, P.H. Beton, M. Henini, P. C. Main, L. Eaves, S. P. Beaumont, and C. D. W. Wilkinson, "Gated resonant tunneling devices," Electron. Lett., 27(2), 134–136 (1991).
K. Maezawa and T. Mizutani, "A new resonant tunneling logic gate employing monostable bistable transition," Jpn. J. Appl. Phys. Pt. 2,32(1A–B), L42–44 (1993).

*Primary Examiner*—Edward P. Westin
*Assistant Examiner*—Benjamin D. Driscoll
*Attorney, Agent, or Firm*—Townsend and Townsend and Crew LLP; Kenneth R. Allen

[57] ABSTRACT

A multiple-valued logic circuit includes a first device, a second device, a signal source, and a signal output terminal. The second device is connected in series with the first device. The signal source supplies an oscillating voltage across a series circuit consisting of the first device and the second device. The first device is constituted by at least one unit device having first and second main terminals and exhibiting voltage-current characteristics including negative differential resistance characteristics for obtaining a peak current between the first and second main terminals. The second device is constituted by at least two series-connected unit devices each having first and second main terminals and exhibiting voltage-current characteristics including variable negative differential resistance characteristics for obtaining a peak current changing between the first and second main terminals. The signal output terminal is connected to at least one of contacts between the unit devices constituting the series circuit.

26 Claims, 43 Drawing Sheets

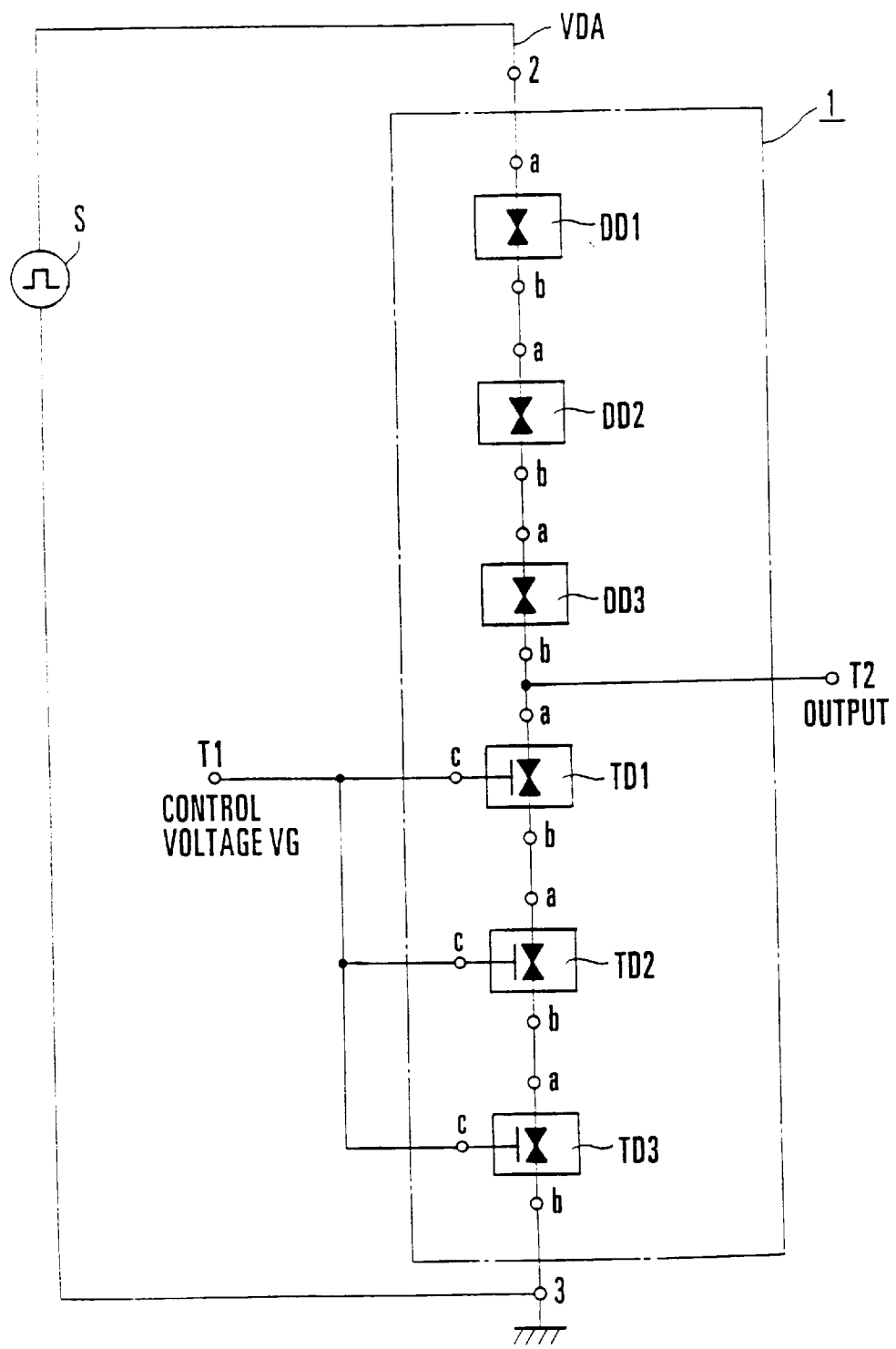
F I G. 1

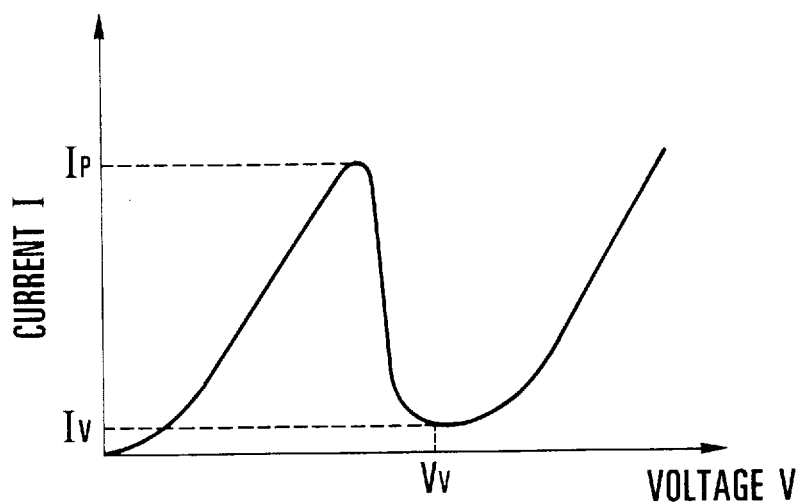
F I G. 2
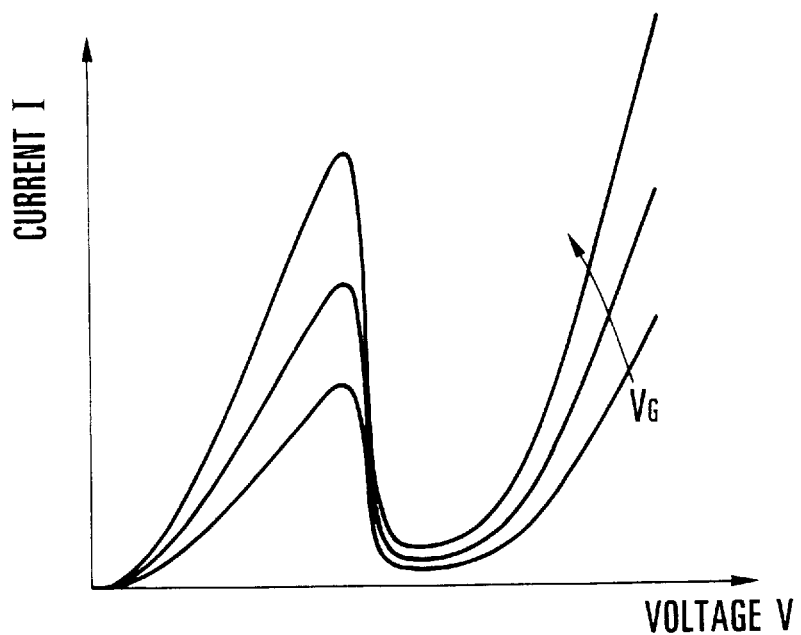
F I G. 3

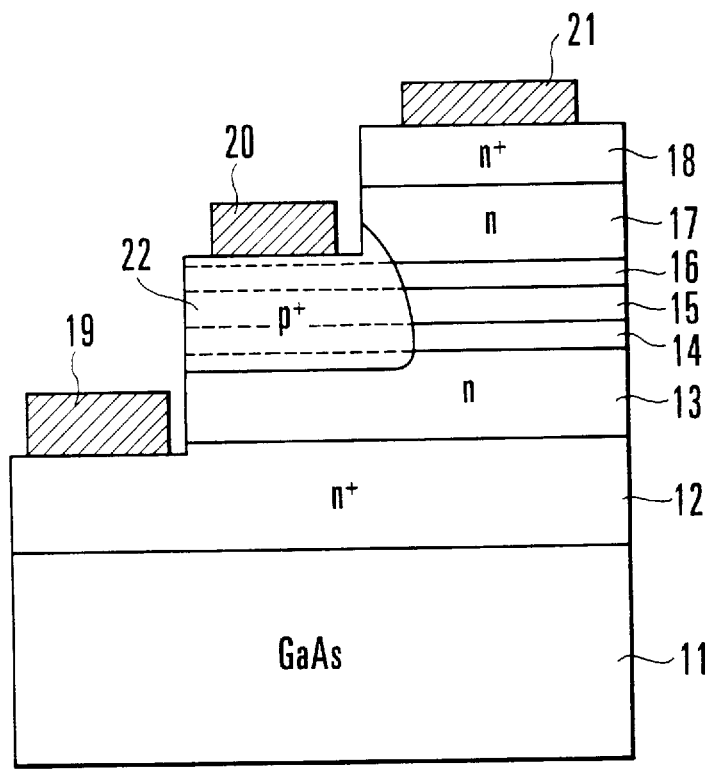
F I G. 4
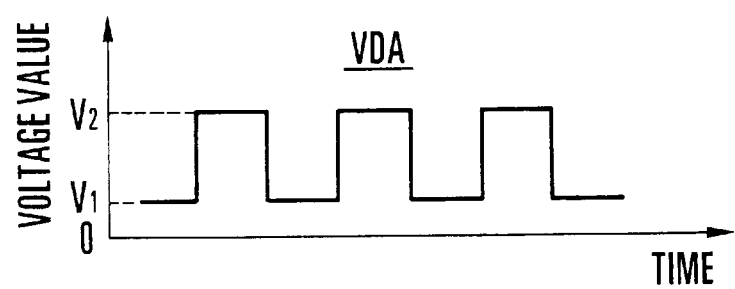
F I G. 5

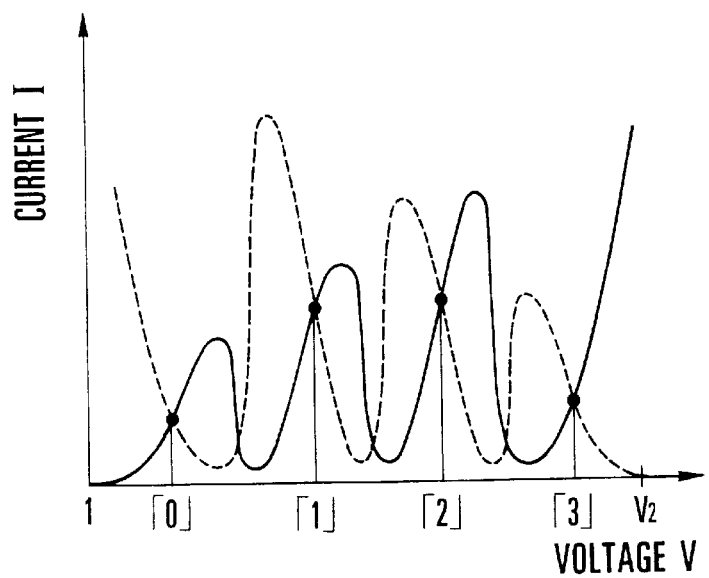
F I G. 6
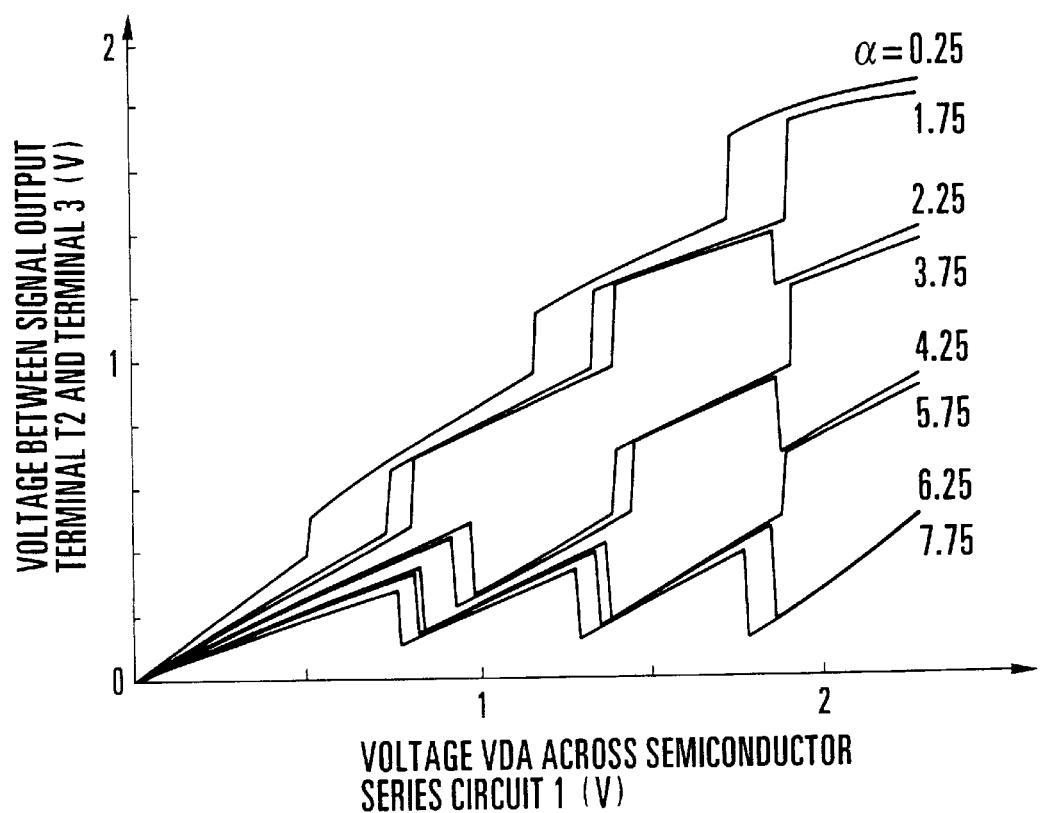
F I G. 7

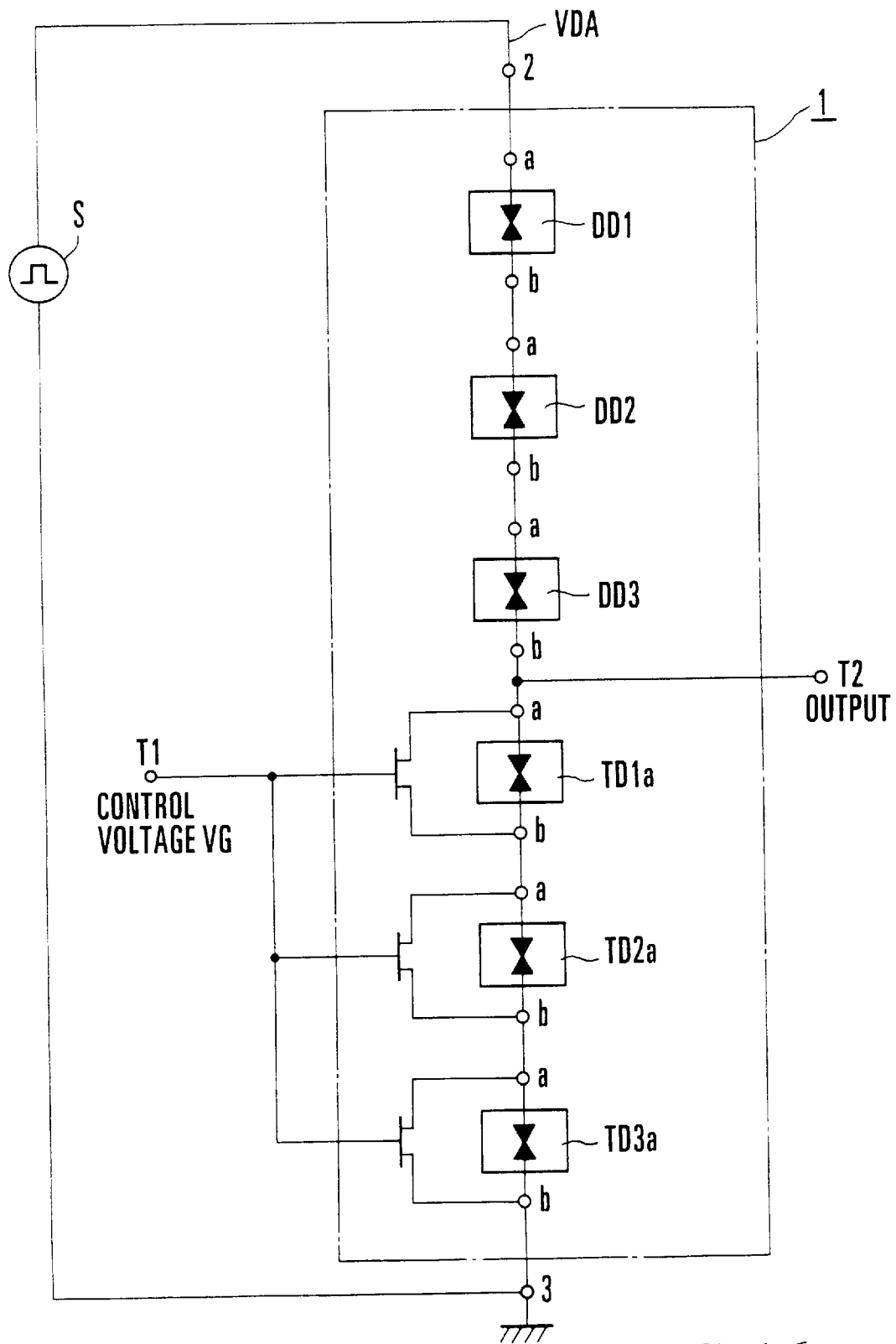
F I G. 16

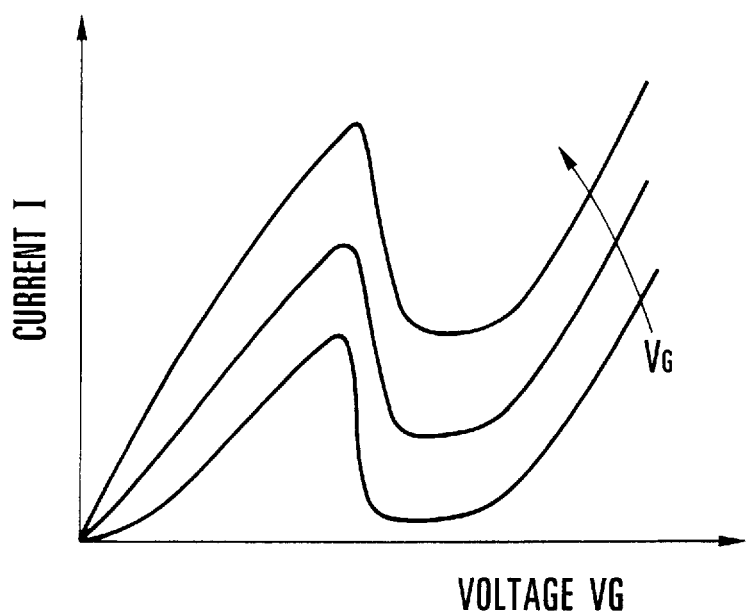
F I G. 17

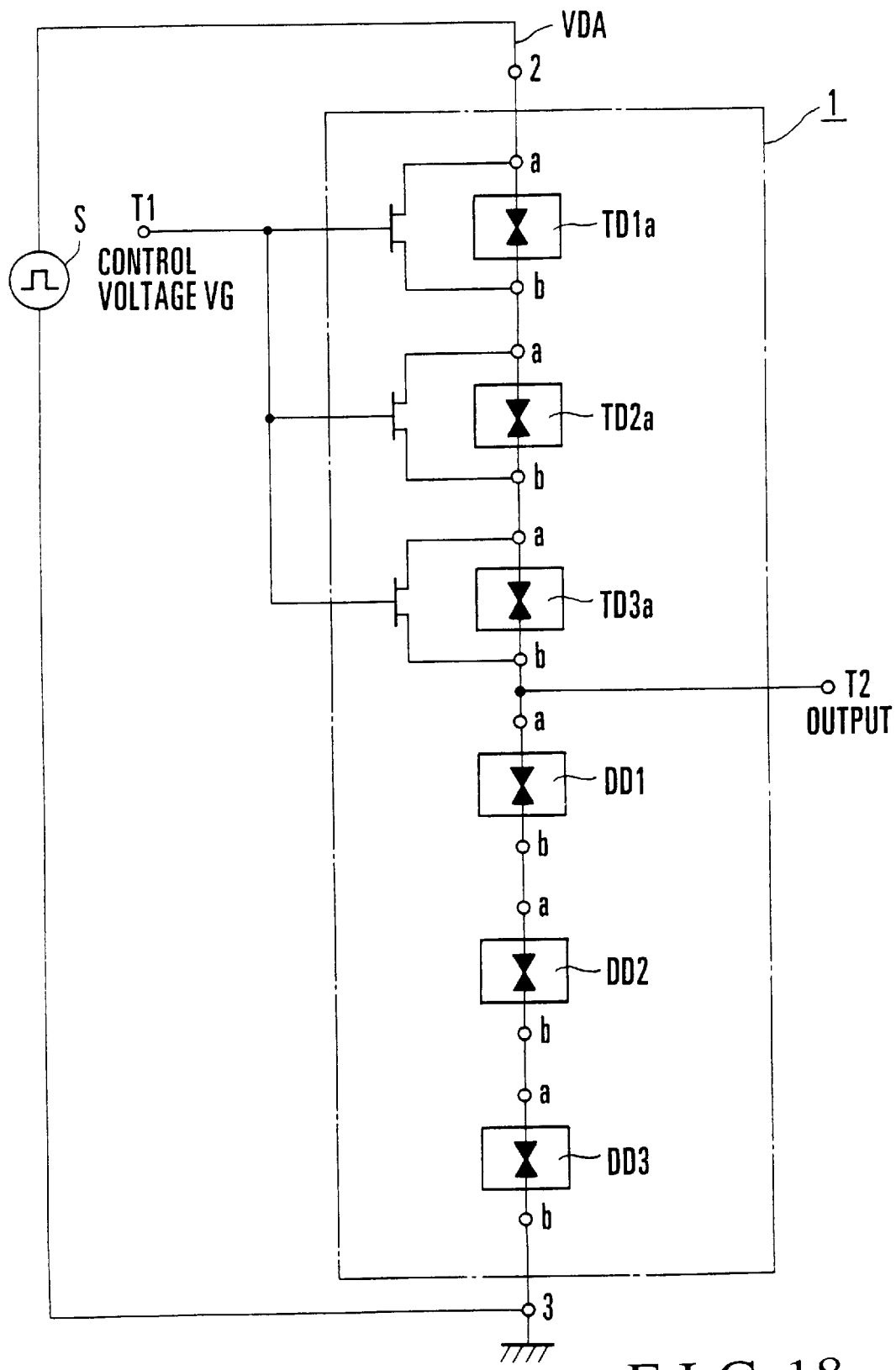
F I G. 18

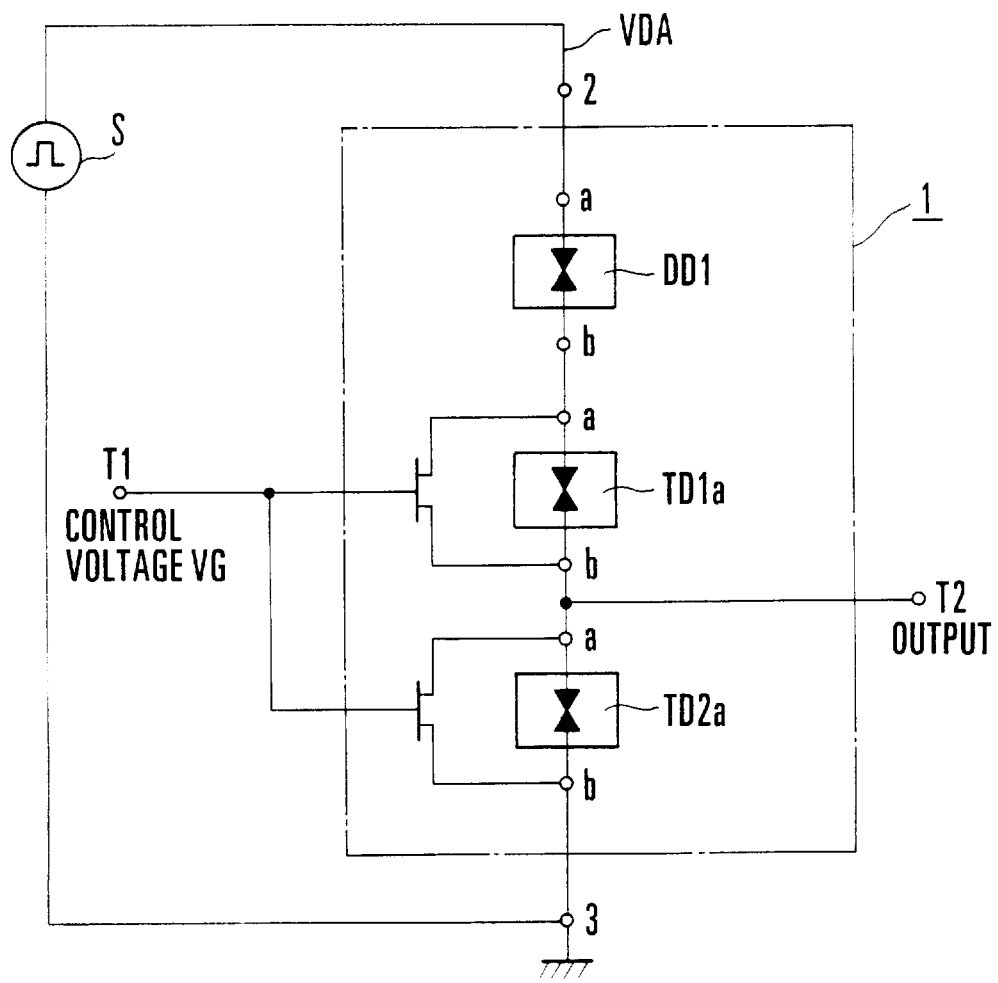
F I G. 19

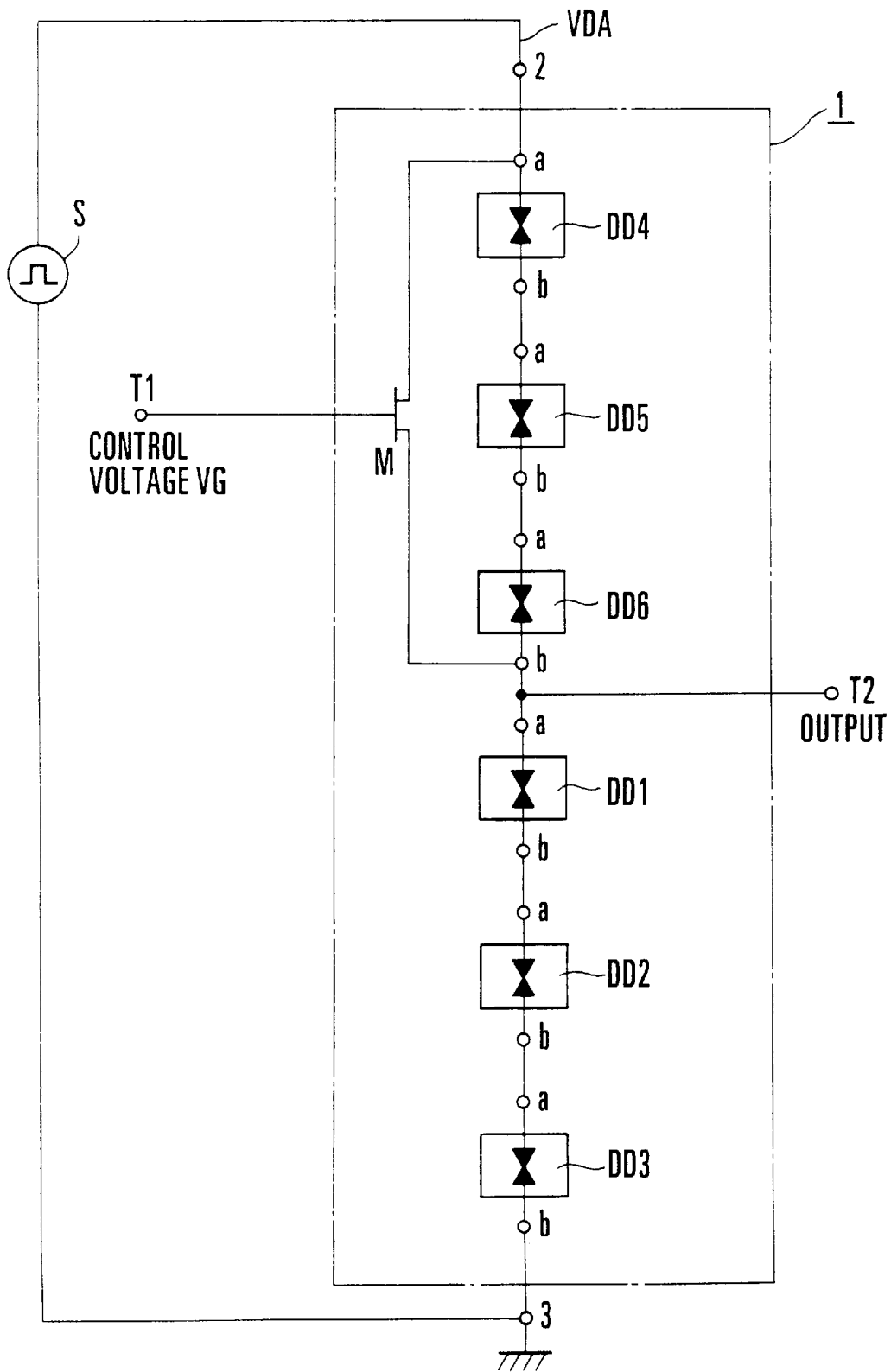
F I G. 21

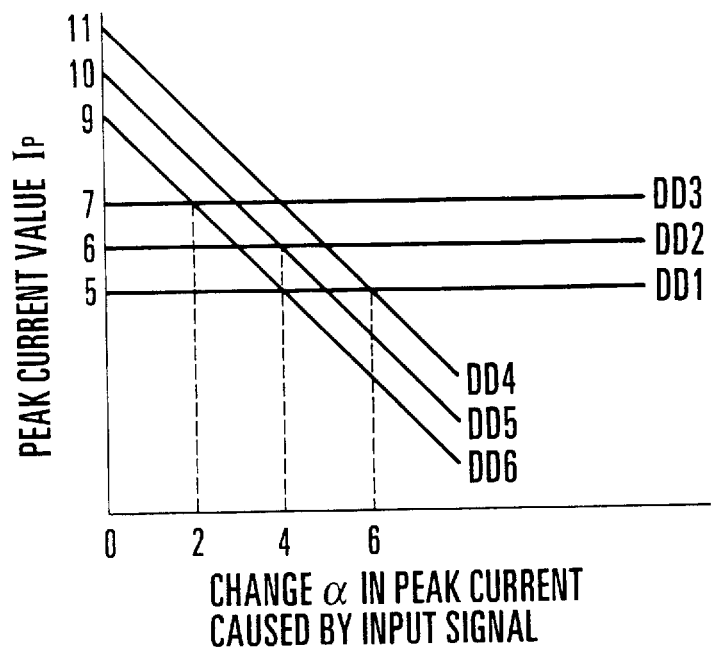
F I G. 23 A
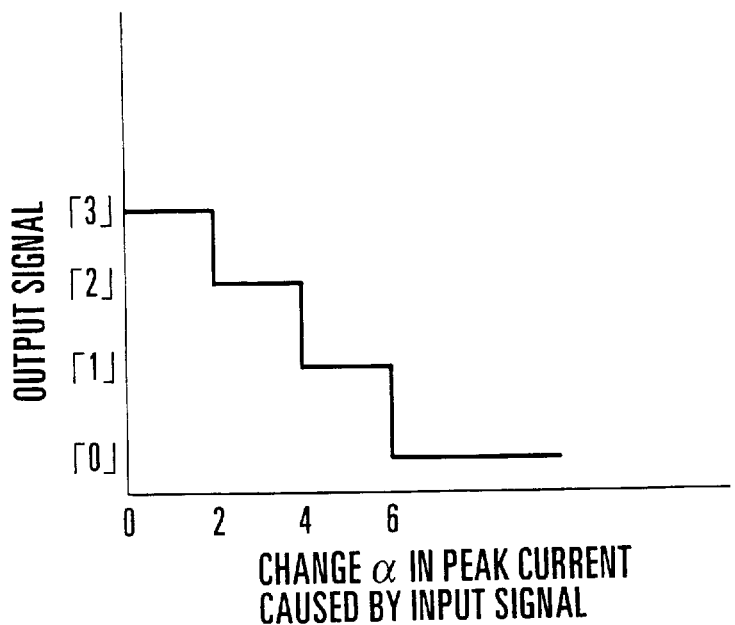
F I G. 23 B

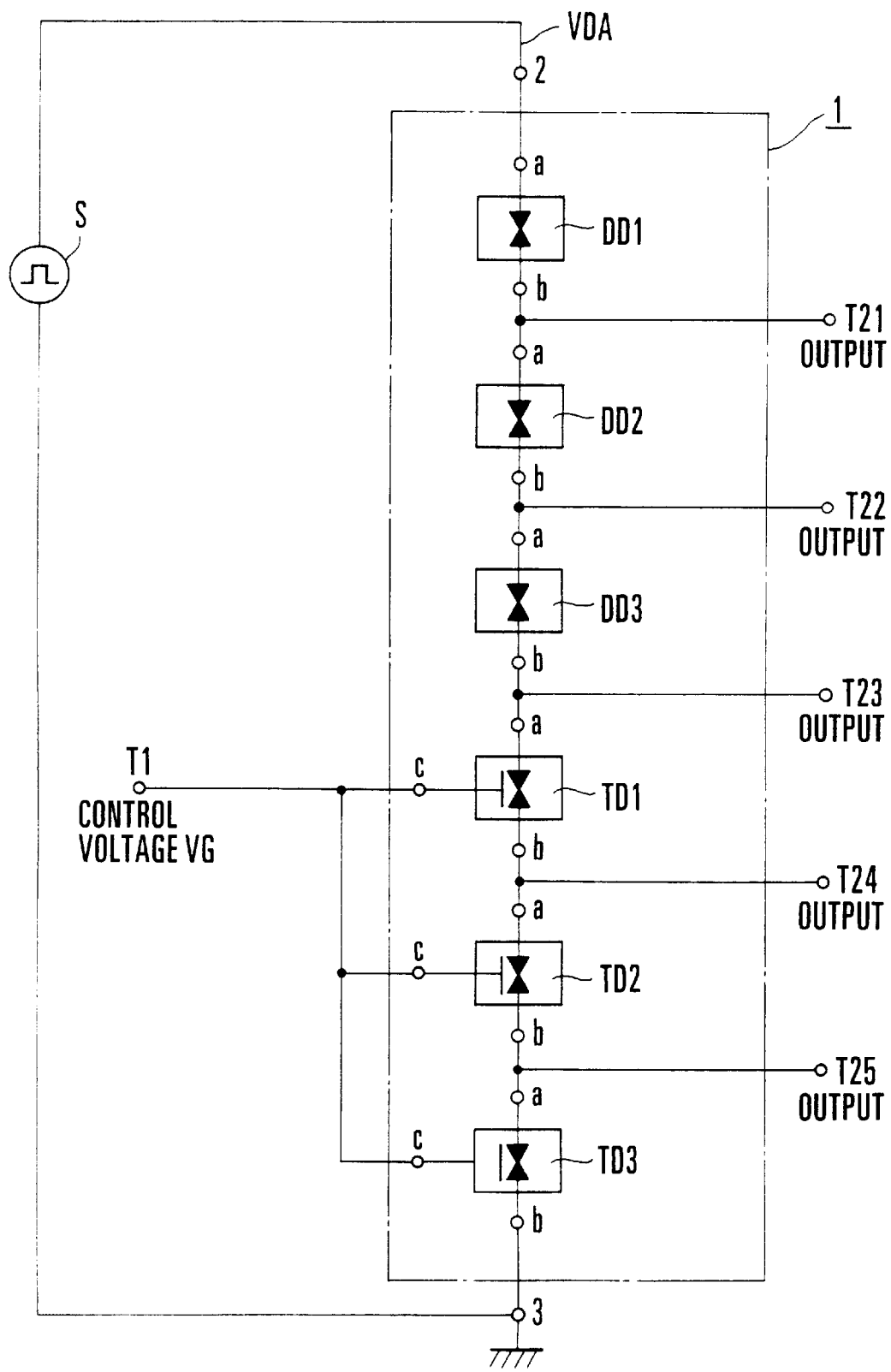
F I G. 24

SYNTHESIS OF LITERAL FUNCTION USING $T_{23}$ AND $T_{25}$

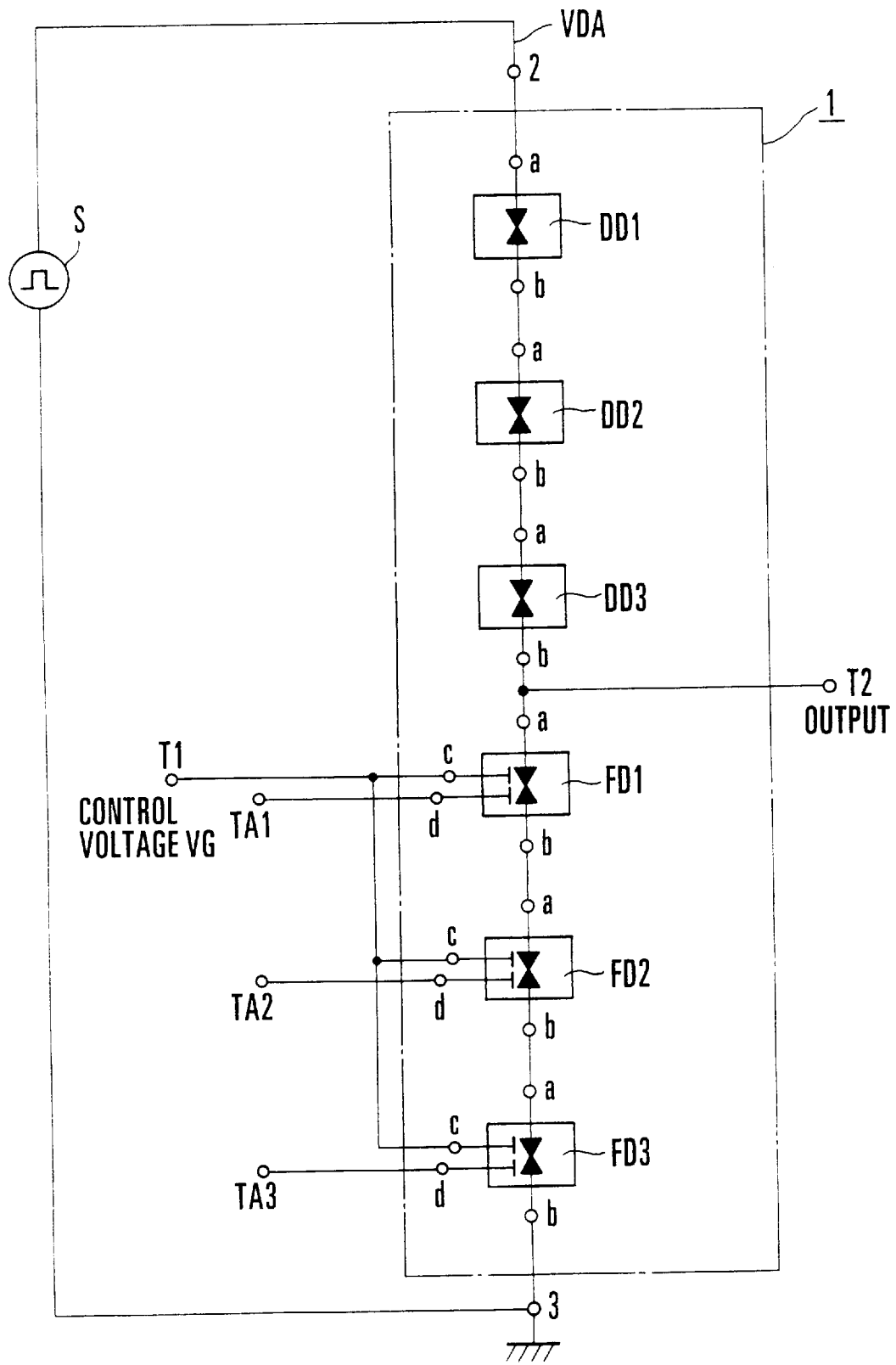
F I G. 26

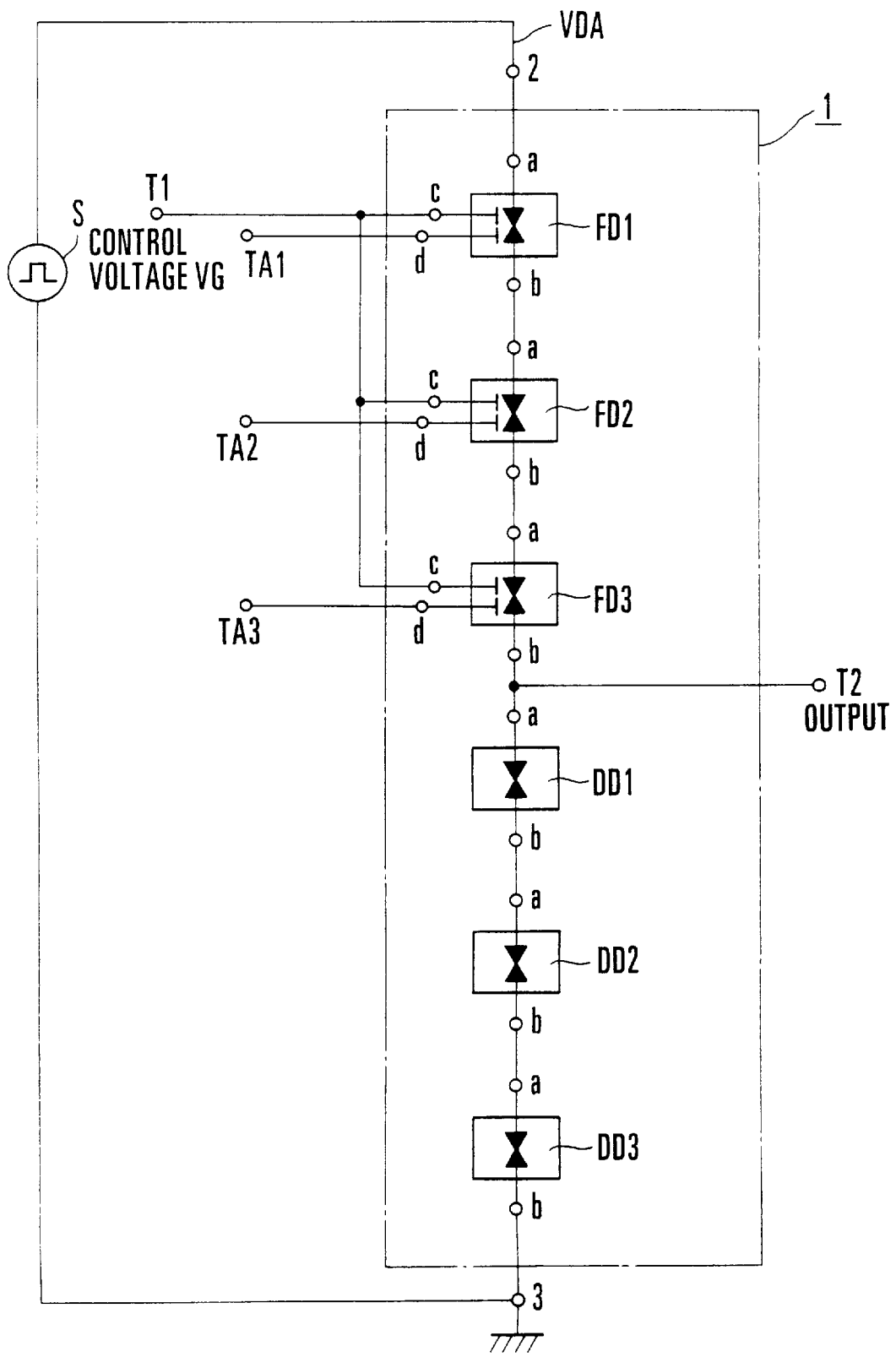
F I G. 28

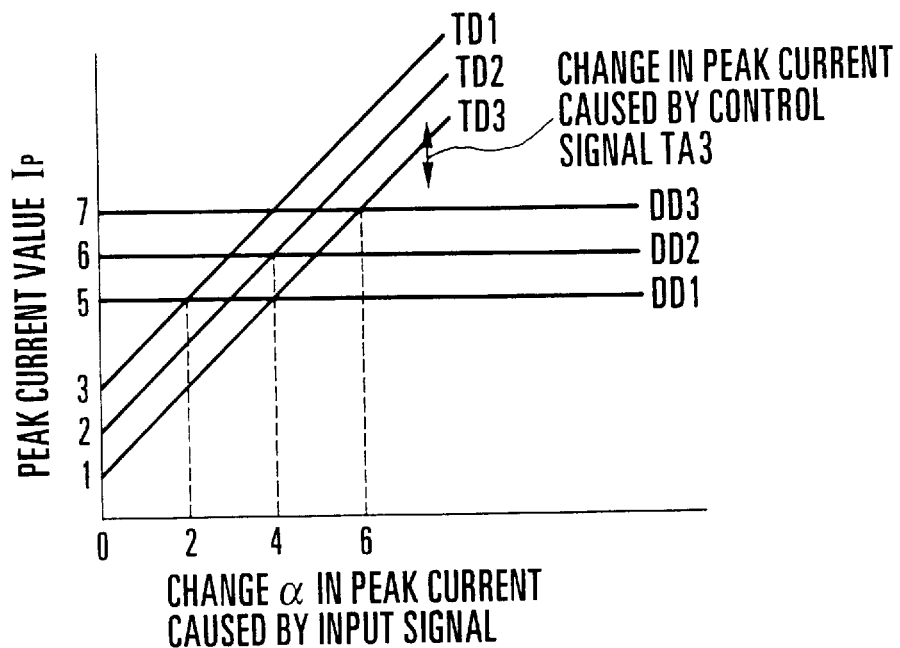
F I G. 29 A
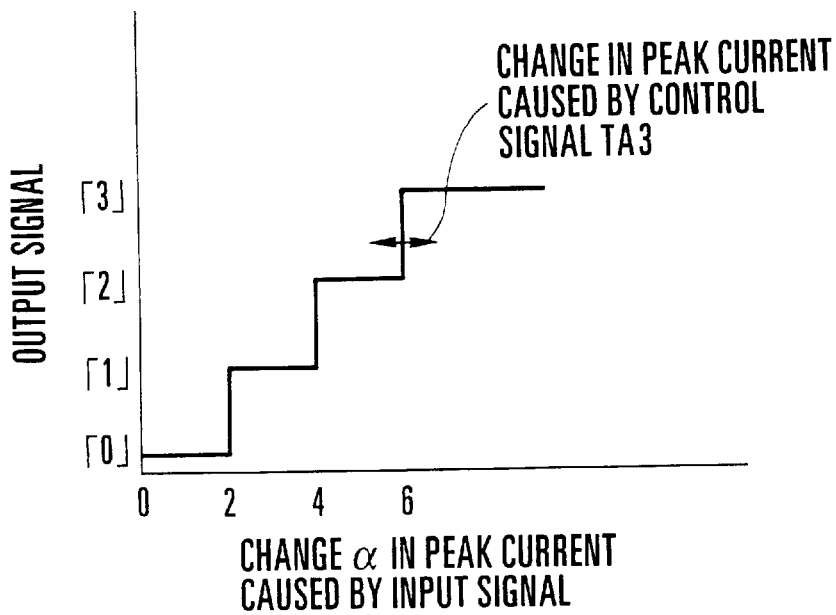
F I G. 29 B

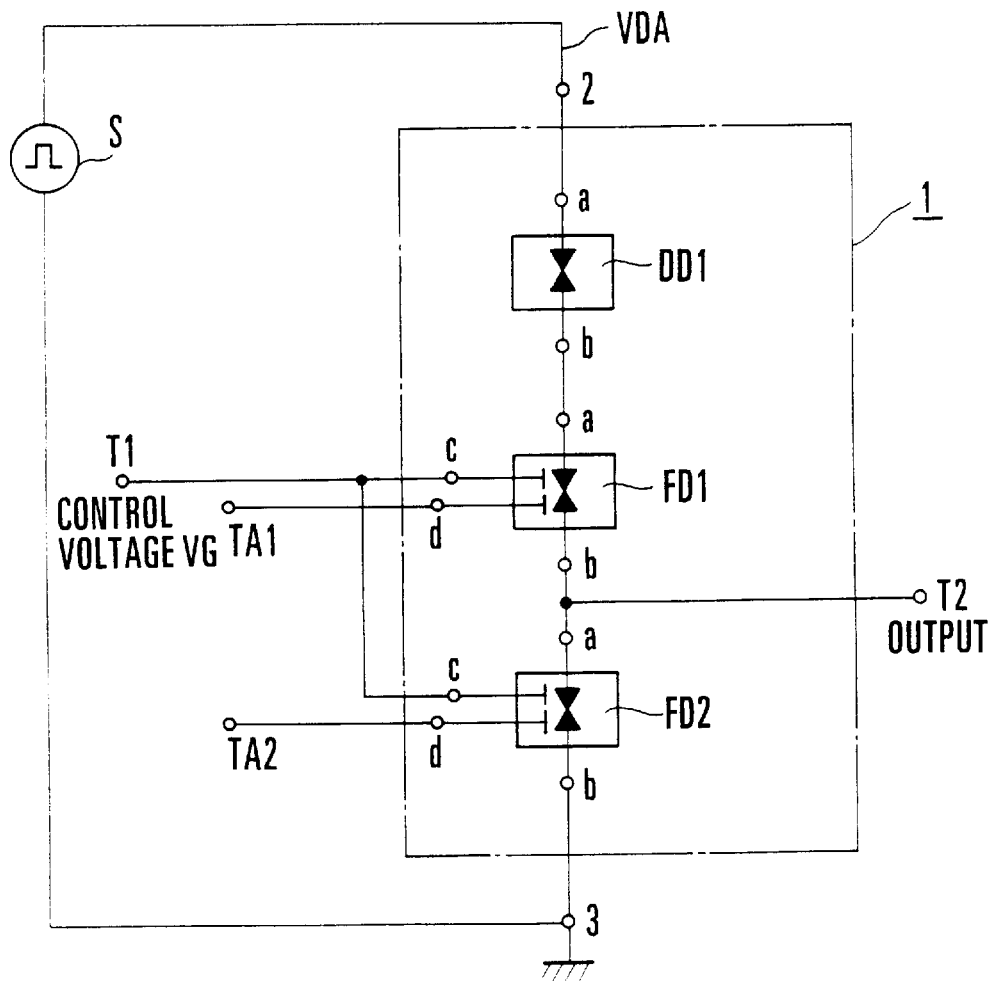
F I G. 30

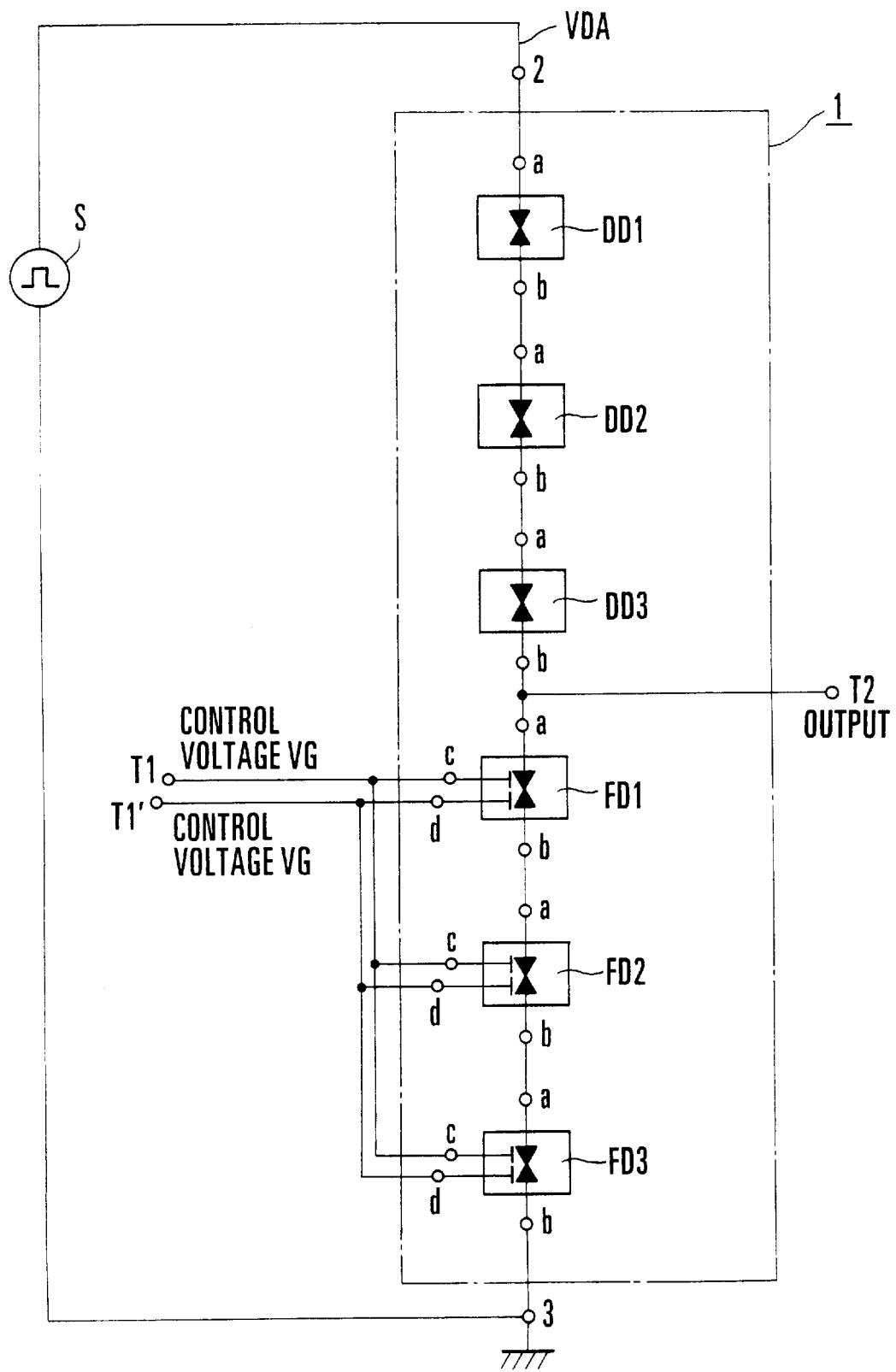
F I G. 32

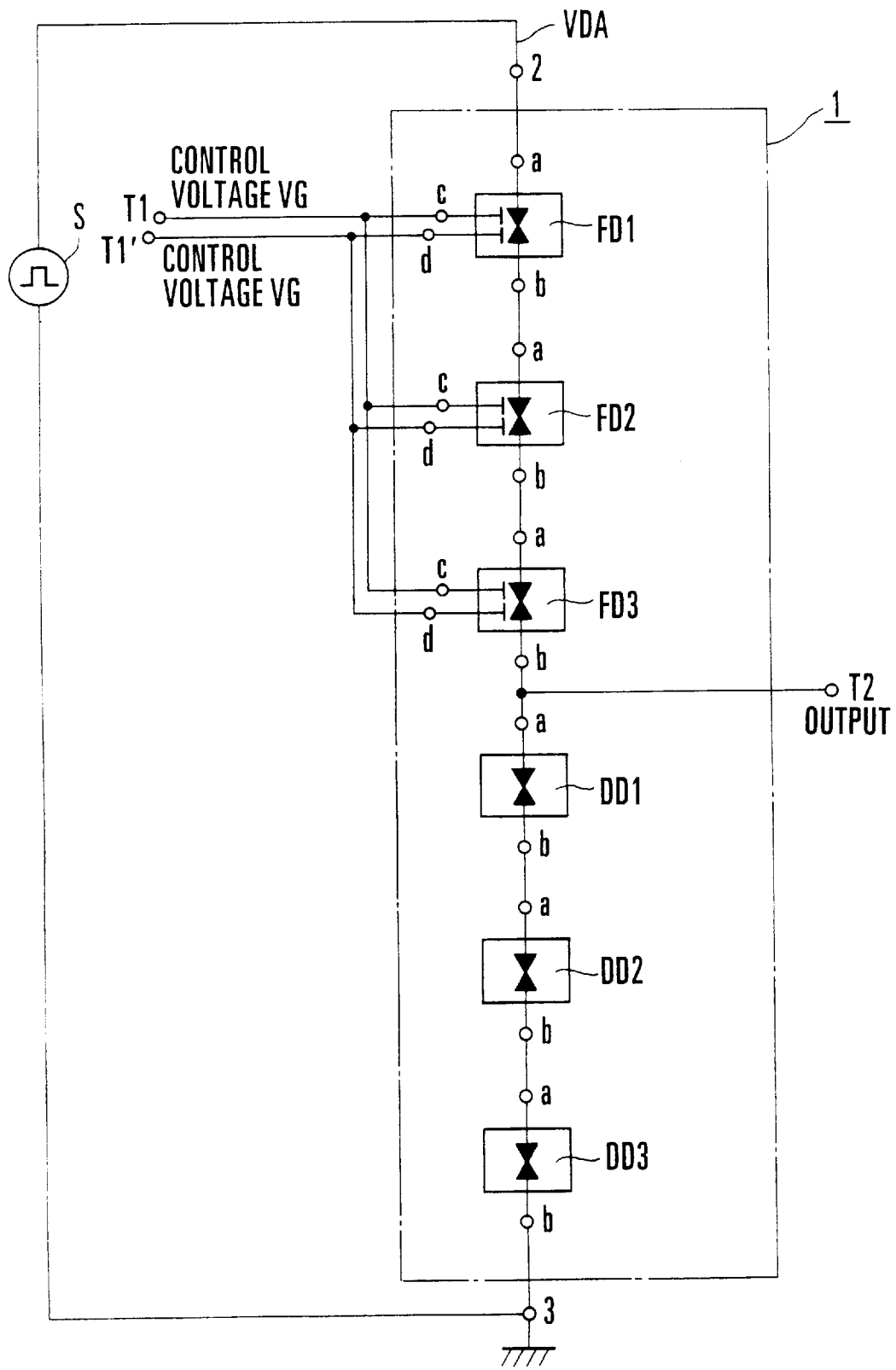
F I G. 34

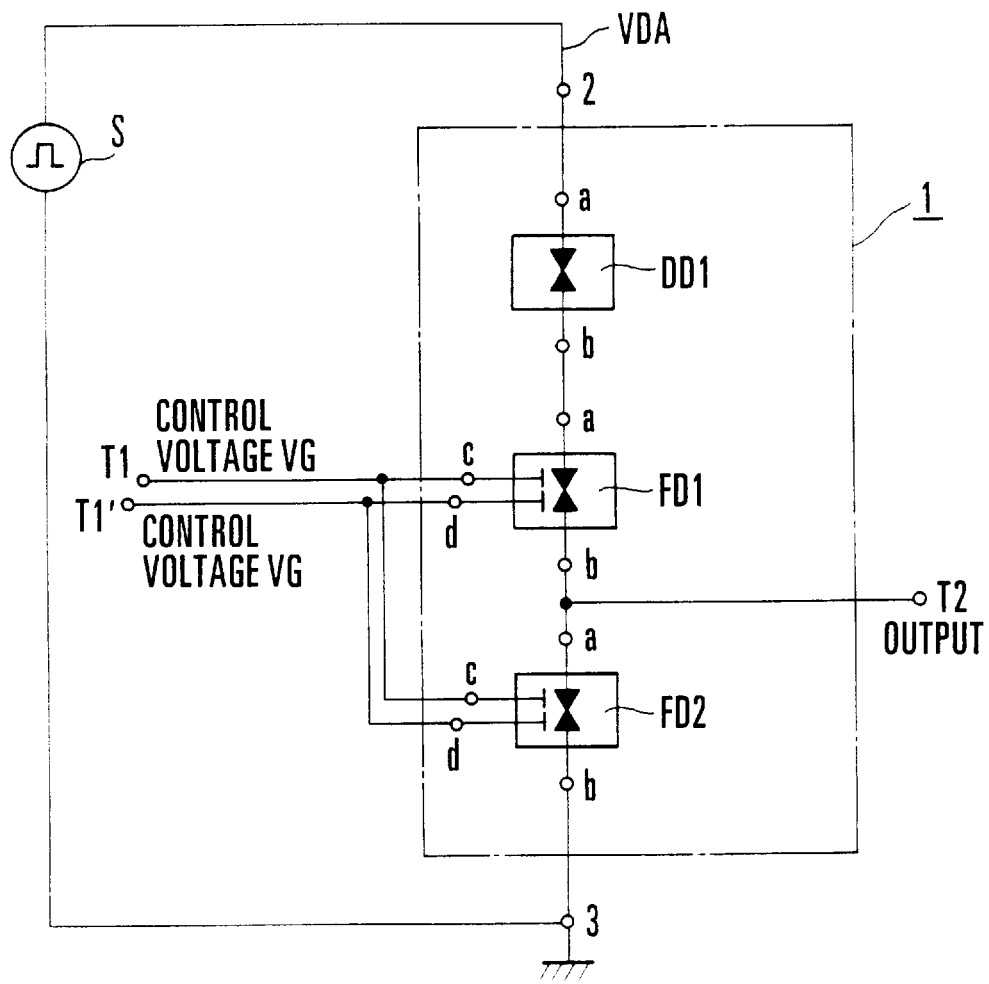
F I G. 35

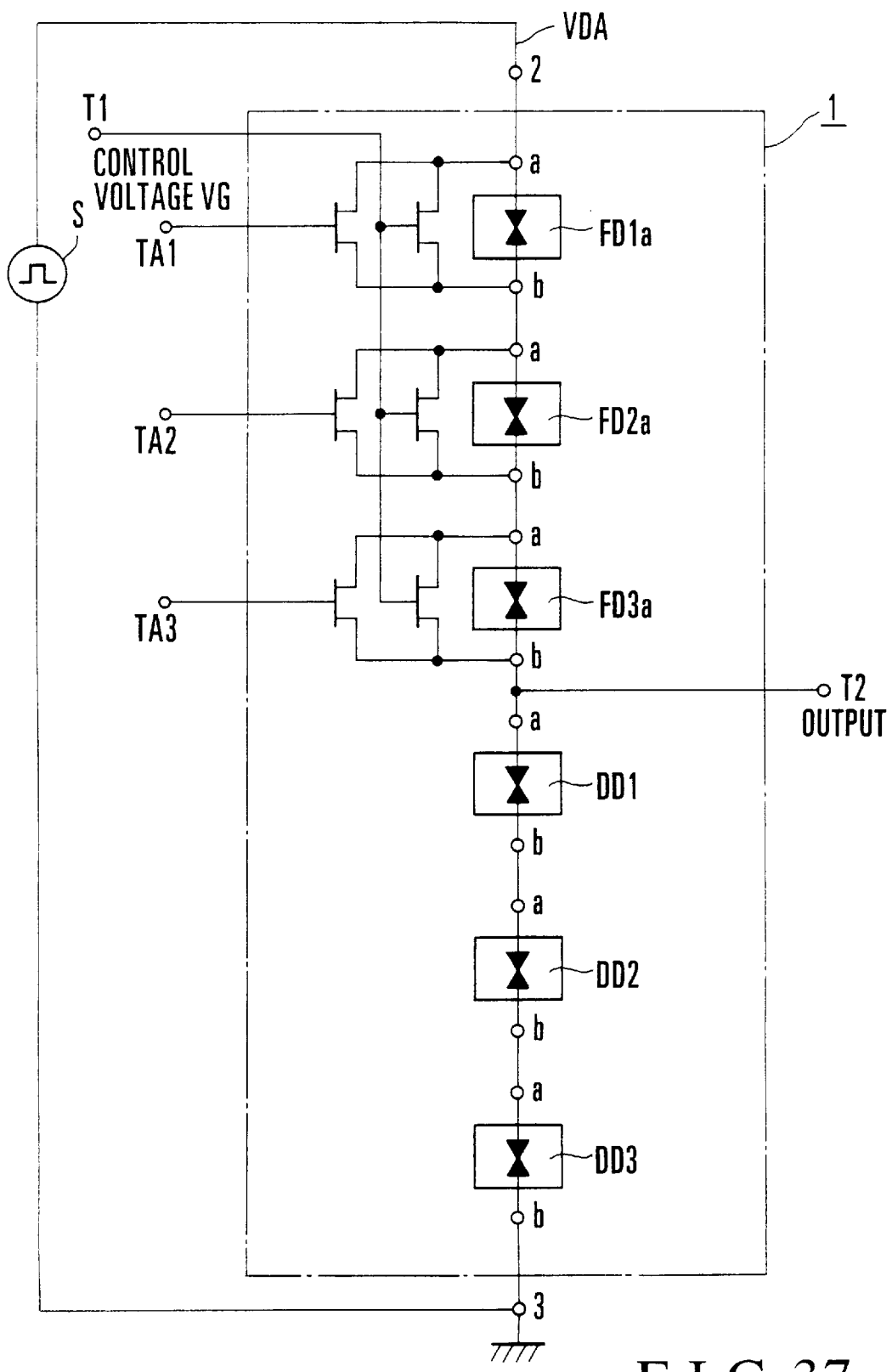
F I G. 37

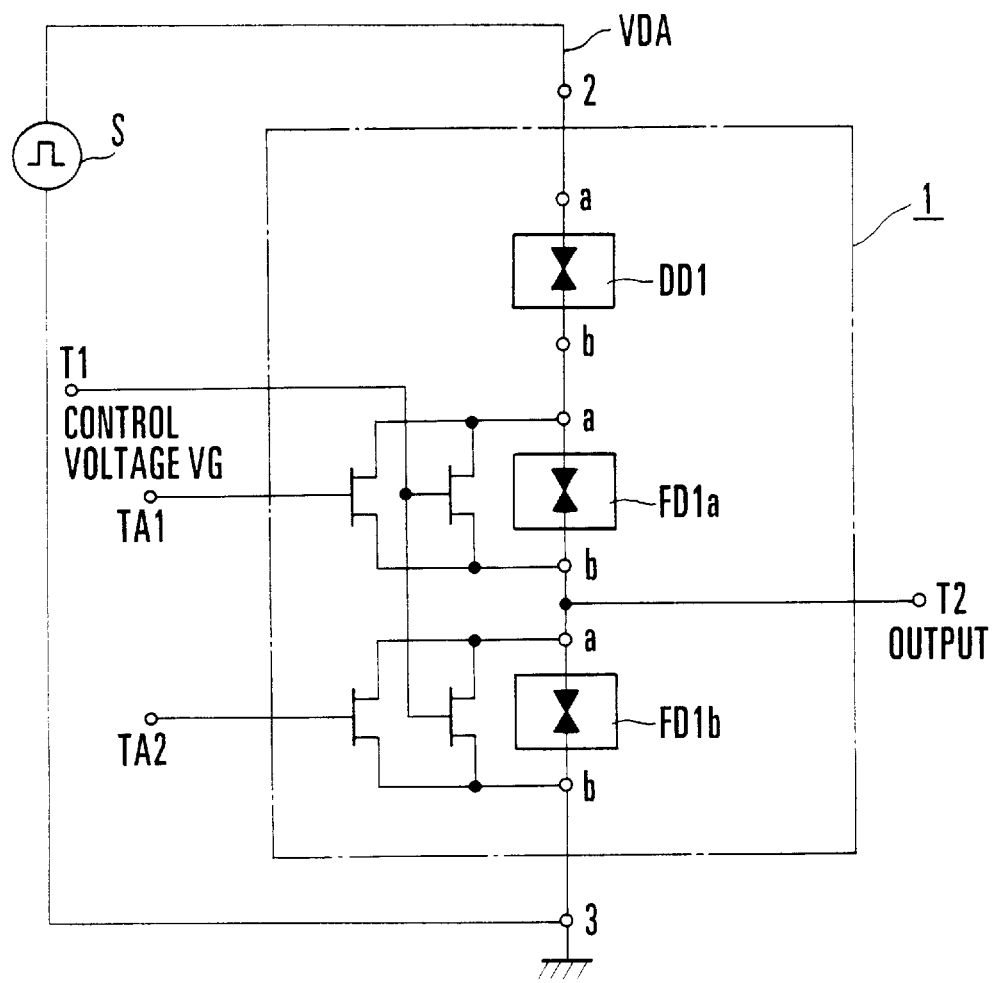
F I G. 38

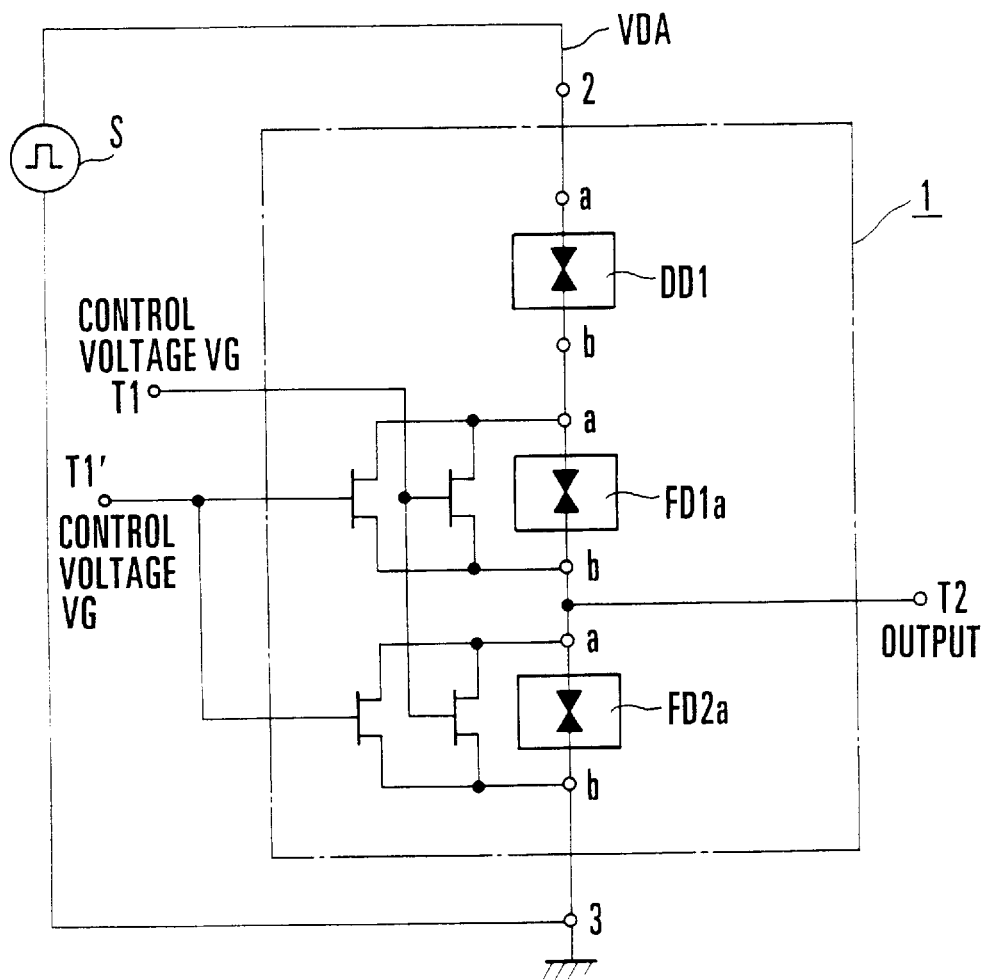
F I G. 41

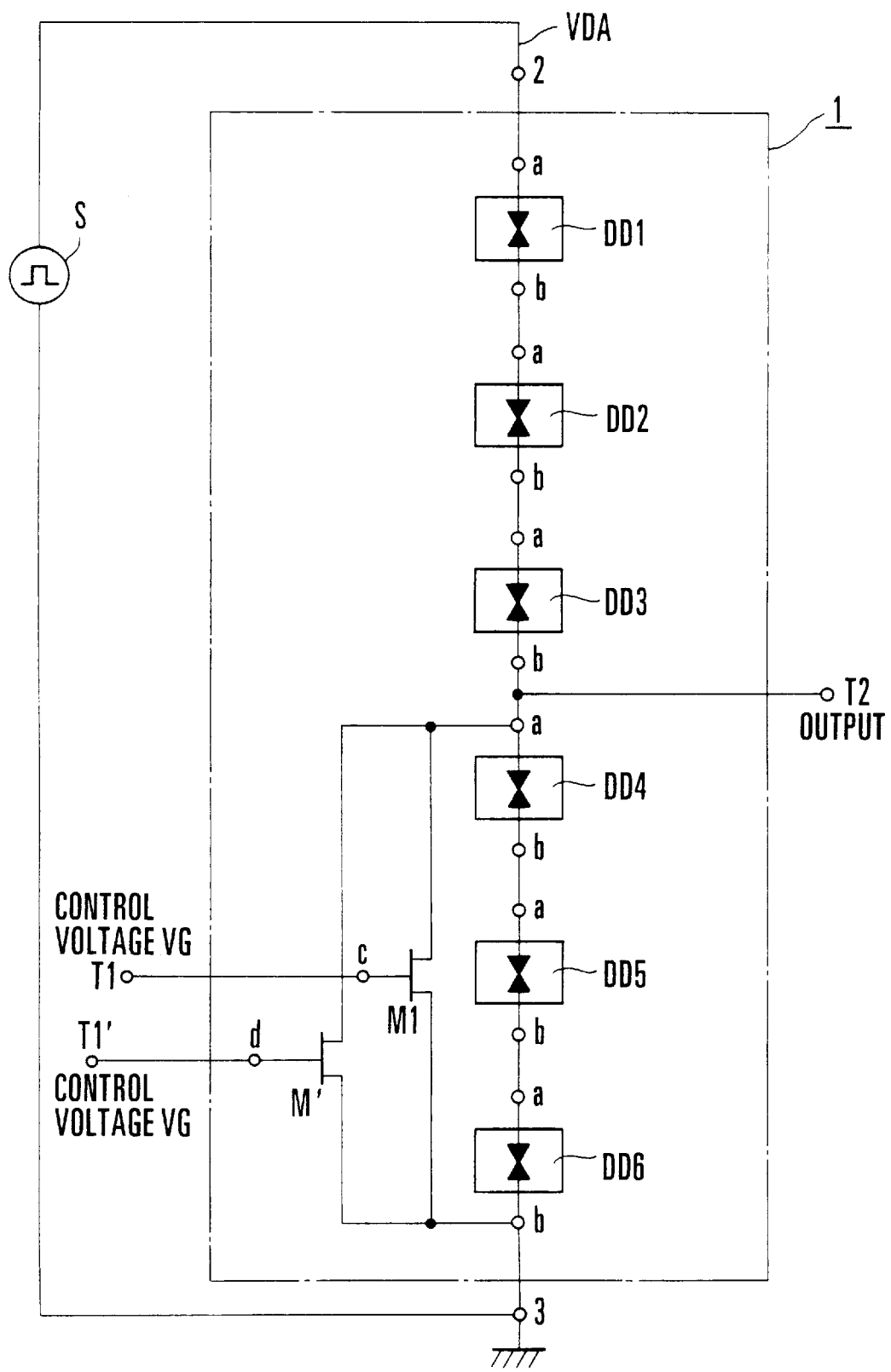
F I G. 42

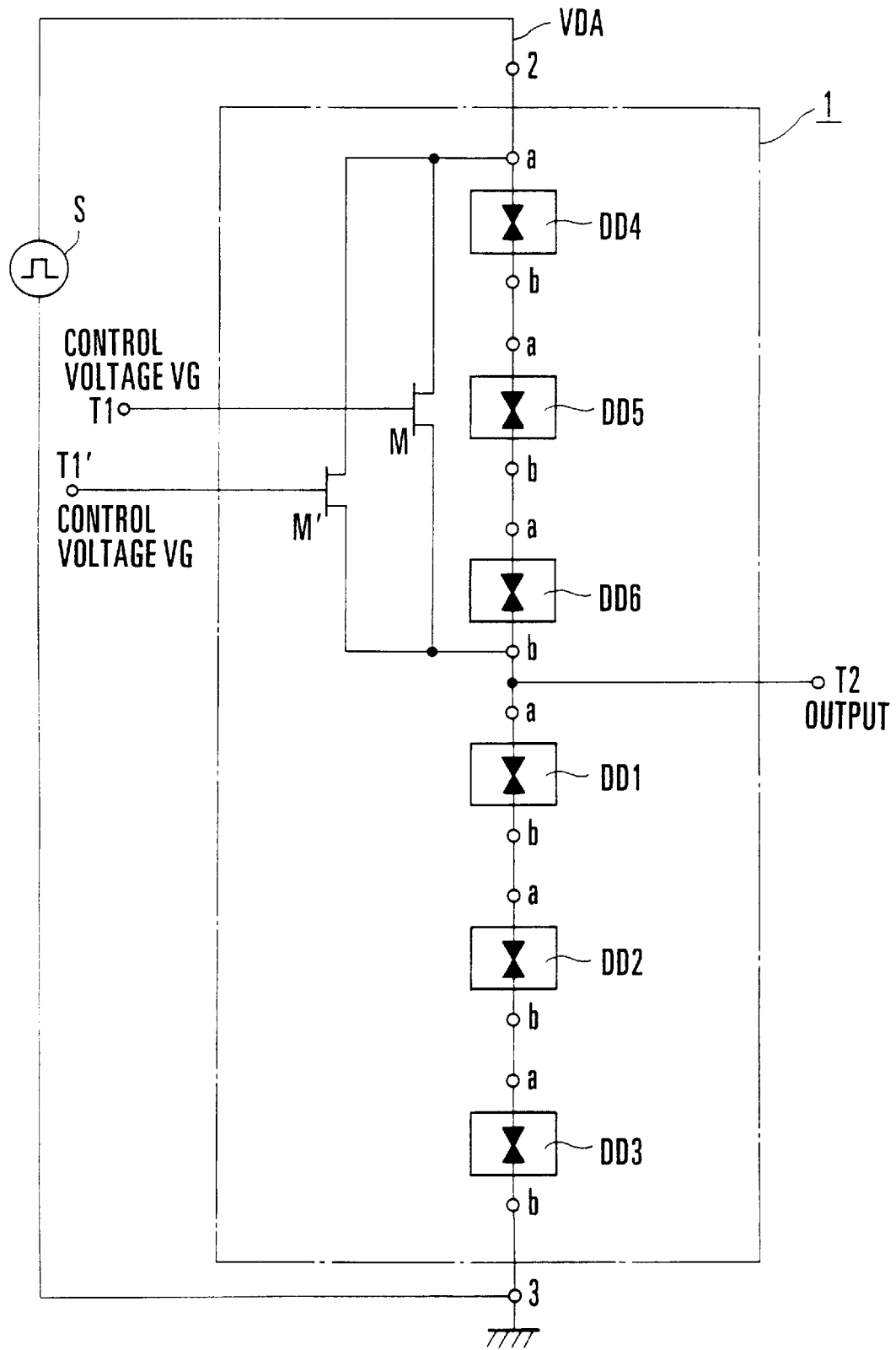
F I G. 43

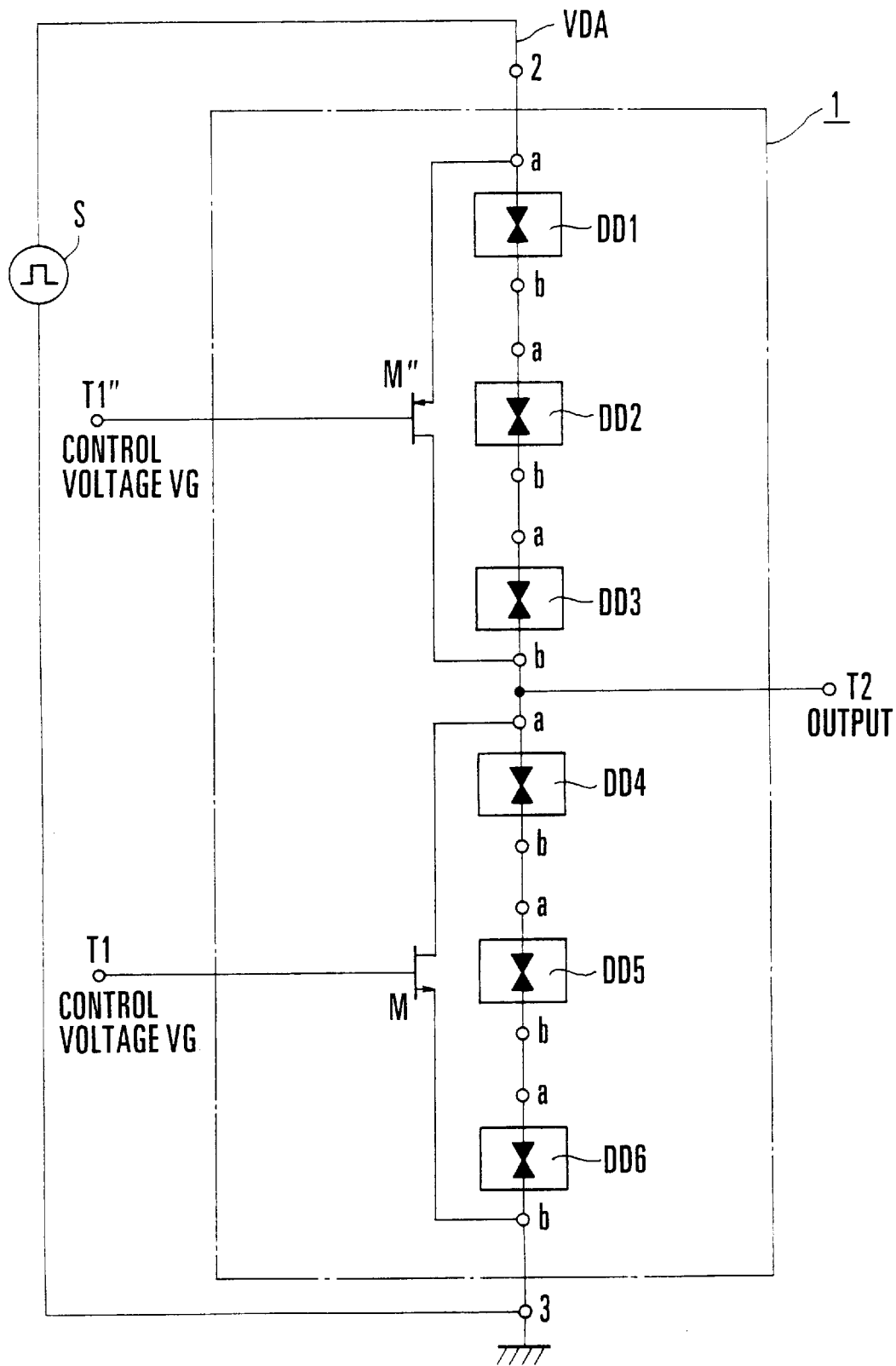
F I G. 44

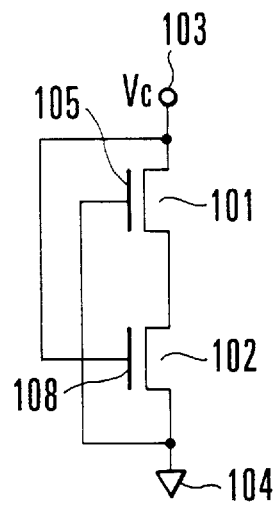
F I G. 46
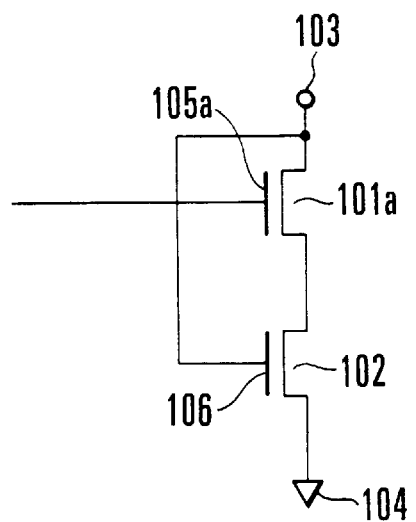
F I G. 47

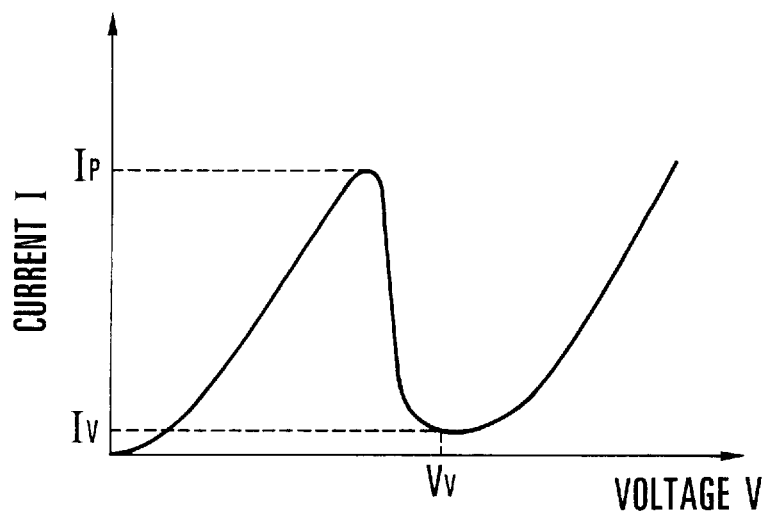
F I G. 49
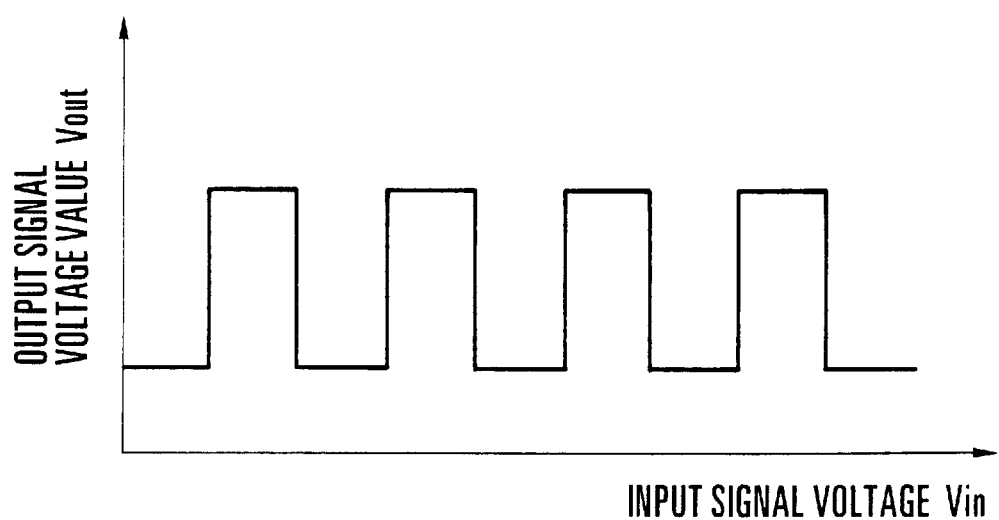
F I G. 50

MULTIPLE-VALUED LOGIC CIRCUIT

BACKGROUND OF THE INVENTION

The present invention relates to a multiple-valued logic circuit and, more particularly, to a multiple-valued logic circuit incorporated in a semiconductor integrated circuit.

Conventionally, various multiple-valued logic circuits using an $I^2L$, an ECL, an nMOS, a current mode CMOS, or the like have been proposed.

A logic circuit using a conventional device is basically operated on the basis of binary logic using, the switching (on/off) function of the device. Hence, to realize a multiple-valued logic circuit, special circuits including a threshold circuit for identifying a multiple-valued input of logic calculation and a level reproduction circuit for generating a multiple-valued output are required.

For this reason, the number and kinds of devices necessary to constitute a multiple-valued logic circuit increase as compared to a binary logic circuit, resulting in a decrease in device density and operation speed. Conventionally, even when a multiple-valued logic circuit is employed, expected effects of improving the performance of an integrated circuit, i.e., decreasing the area needed for interconnections or increasing the operation speed by decreasing the number of logic stages cannot be obtained, so no advantage over binary logic can be observed.

As a prior art, there is a multiple-valued ECL quantization circuit (T. Higuchi and M. Kameyama, "Multiple-Valued Digital Processing System", Shokodo, 1989).

This circuit is a multiple-valued logic circuit using a threshold value detection section and a current mirror circuit as basic components. In addition to 14 normal transistors and four resistors, a transistor driving power supply and three reference voltage sources are required.

A circuit using an nMOS has also been proposed (D. Etiemble and M. Israel, Comparison of binary and multi-valued ICs according to VLSI criteria, Computer, p. 28, April 1988).

However, this proposal also has the following problems.

To manufacture a transistor having a plurality of threshold values on a substrate, a plurality of times of ion implantation processes are required to pose a problem on the manufacturing process.

To manufacture a transistor having various transconductance threshold values on a substrate, a plurality of device patterns with different channel widths and channel lengths are required to pose a problem on the pattern design.

The negative differential resistance characteristics of a resonant-tunneling device are used to obtain a multiple-stable state by a plurality of series-connected devices. This device is more suitable for multiple-valued logic than a conventional device with only a switching function, so that a multiple-valued logic circuit using resonant-tunneling devices has been proposed (G. Frazier, A. Taddiken, A. Seabaugh and J. Randall, Nanoelectronic circuits using resonant tunneling transistors and diodes, ISSCC 93 TP11.4, p. 174).

FIG. 48 shows a conventional multiple-valued logic circuit using the above-mentioned resonant-tunneling devices. This multiple-valued logic circuit has an arrangement in which four series-connected resonant-tunneling diodes are connected in series with two field effect transistors. Referring to FIG. 48, each of resonant-tunneling diodes $DD_1$ to $DD_4$ has first and second main terminals a and b. These resonant-tunneling diodes $DD_1$ to $DD_4$ are connected in series to constitute a series circuit 1. The resonant-tunneling diodes used in this circuit generally have voltage-current characteristics including negative differential resistance characteristics for obtaining a peak current value Ip between the first main terminal a and the second main terminal b, as shown in FIG. 49. In FIG. 48, the resonant-tunneling diodes $DD_1$ to $DD_4$ have different peak current values Ip1 to Ip4, respectively.

In FIG. 48, one of the output terminals (source) of an enhancement type field effect transistor M is connected to the series circuit 1. The other output terminal of this transistor is connected to a power supply terminal 2 through a load L using a depletion type field effect transistor M' whose gate and source are connected to each other, from which a constant power supply voltage VD is supplied. In this case, the transistors M and M' are of an n-channel type. A ground terminal 3 to be paired with the power supply terminal 2 is connected to the other terminal of the series circuit 1. The gate of the transistor M is connected to a signal input terminal T1. A signal output terminal T2 is connected to the middle connection point between the transistor M and the load L.

Assume that an input signal having a voltage $V_{in}$ is supplied to the signal input terminal T1 while an output signal having a voltage $V_{out}$ is output to the signal output terminal T2, and the power supply voltage VD is kept applied between the power supply terminal 2 and the terminal 3.

In the multiple-valued logic circuit with this arrangement of the conventional resonant-tunneling diodes, a relationship as shown in FIG. 50 is established between the input signal voltage $V_{in}$ and the output signal voltage $V_{out}$.

In this arrangement, however, multiple valued outputs according to the fixed negative differential resistance characteristics of the resonant-tunneling diodes are not obtained. Therefore, only a multiple-valued logic circuit with a limited degree of freedom is obtained.

In addition, since the multiple-valued logic circuit with this arrangement uses the field effect transistors M and M' of different types, the multiple-valued logic circuit cannot be easily manufactured. To expand the function, e.g., to form an adder, conventional devices must be combined with this circuit, so that the number and kinds of devices inevitably increase as in the arrangement using only binary devices such as a CMOS.

Therefore, even if the resonant-tunneling devices are used, the same problems as in the multiple-valued logic circuit using conventional devices are posed.

SUMMARY OF THE INVENTION

It is the principal object of the present invention to provide a multiple-valued logic circuit which can be constituted by a smaller number of devices and a smaller number of different kinds of devices.

It is another object of the present invention to provide a multiple-valued logic circuit with a higher degree of freedom in design to obtain multiple-valued logic suitable for desired characteristics.

In order to achieve the above objects, according to the present invention, there is provided a multiple-valued logic circuit comprising a first device, a second device connected in series with the first device, a signal source for supplying an oscillating voltage across a series circuit consisting of the first device and the second device, and a signal output terminal, wherein the first device is constituted by at least one unit device having first and second main terminals and exhibiting voltage-current characteristics including negative differential resistance characteristics for obtaining a peak current between the first and second main terminals, the second device is constituted by at least two series-connected unit devices each having first and second main terminals and exhibiting voltage-current characteristics including variable negative differential resistance characteristics for obtaining a peak current changing between the first and second main terminals, and the signal output terminal is connected to at least one of contacts between the unit devices constituting the series circuit.

BRIEF DESCRIPTION OF THE DRAWINGS

FIG. 1 is a circuit diagram showing the arrangement of a multiple-valued logic circuit according to the first embodiment of the present invention;

FIG. 2 is a graph showing the peak current characteristics of devices DD1 to DD3 in FIG. 1;

FIG. 3 is a graph showing the peak current characteristics of three-terminal devices TD1 to TD3 in FIG. 1;

FIG. 4 is a sectional view showing an example of the three-terminal device in the first embodiment;

FIG. 5 is a waveform chart showing the characteristics of a power supply voltage VDA applied to a power supply terminal 2;

FIG. 6 is a graph showing the voltage-current characteristics of the multiple-valued logic circuit in FIG. 1;

FIG. 7 is a graph showing a change in voltage at a signal output terminal T2 with respect to the voltage VDA applied to the power supply terminal 2;

FIG. 16 is a circuit diagram showing the arrangement of a multiple-valued logic circuit according to the fifth embodiment of the present invention;

FIG. 17 is a graph showing the peak current characteristics of three-terminal devices TD1$a$ to TD3$a$ of the fifth embodiment;

FIG. 18 is a circuit diagram showing the arrangement of a multiple-valued logic circuit according to the sixth embodiment of the present invention;

FIG. 19 is a circuit diagram showing the arrangement of a multiple-valued logic circuit according to the seventh embodiment of the present invention;

FIG. 21 is a circuit diagram showing the arrangement of a multiple-valued logic circuit according to the ninth embodiment of the present invention;

FIGS. 23A and 23B are graphs showing the function of the multiple-valued logic circuit of the 10th embodiment;

FIG. 24 is a circuit diagram showing the arrangement of a multiple-valued logic circuit according to the 11th embodiment of the present invention;

FIG. 26 is a circuit diagram showing the arrangement of a multiple-valued logic circuit according to the 12th embodiment of the present invention;

FIG. 28 is a circuit diagram showing the arrangement of a multiple-valued logic circuit according to the 13th embodiment of the present invention;

FIGS. 29A and 29B are graphs showing the function of the multiple-valued logic circuit of the 13th embodiment;

FIG. 30 is a circuit diagram showing the arrangement of a multiple-valued logic circuit according to the 14th embodiment of the present invention;

FIG. 32 is a circuit diagram showing the arrangement of a multiple-valued logic circuit according to the 15th embodiment of the present invention;

FIG. 34 is a circuit diagram showing another arrangement of the multiple-valued logic circuit of the 15th embodiment;

FIG. 35 is a circuit diagram showing still another arrangement of the multiple-valued logic circuit of the 15th embodiment;

FIG. 37 is a circuit diagram showing another arrangement of the multiple-valued logic circuit of the 16th embodiment;

FIG. 38 is a circuit diagram showing still another arrangement of the multiple-valued logic circuit of the 16th embodiment;

FIG. 41 is a circuit diagram showing still another arrangement of the multiple-valued logic circuit of the 17th embodiment;

FIG. 42 is a circuit diagram showing the arrangement of a multiple-valued logic circuit according to the 18th embodiment of the present invention;

FIG. 43 is a circuit diagram showing another arrangement of the multiple-valued logic circuit of the 18th embodiment;

FIG. 44 is a circuit diagram showing the arrangement of a multiple-valued logic circuit according to the 19th embodiment of the present invention;

FIG. 46 is a circuit diagram of a two-terminal device with negative differential resistance characteristics used in the present invention, which consists of CMOS transistors;

FIG. 47 is a circuit diagram of a three-terminal device with negative differential resistance characteristics used in the present invention, which consists of CMOS transistors;

FIG. 49 is a graph showing the voltage-current characteristics of a resonant-tunneling diode; and FIG. 50 is a graph showing the function of the conventional multiple-valued logic circuit.

DESCRIPTION OF THE PREFERRED EMBODIMENTS

Figure 8:
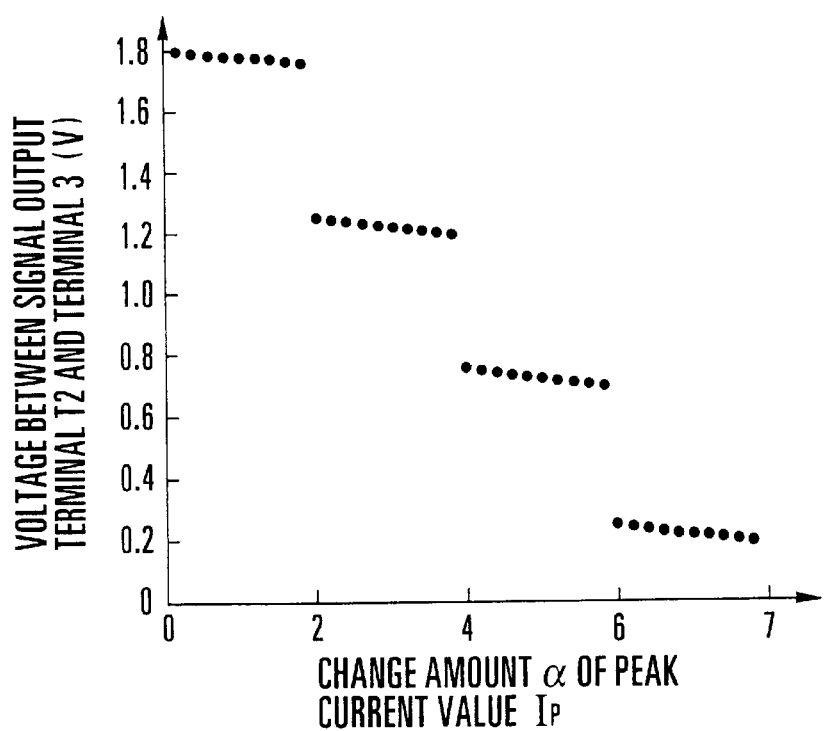
FIG. 8 is a graph showing the relationship between a change amount α and the voltage at the signal output terminal T2.

First, the present invention will be generally described below.

In a device such as a resonant-tunneling diode having voltage-current characteristics including negative differential resistance characteristics, when a current flowing through the device increases beyond the peak current value of the device, the device switches from a low-resistance state (ON state) to a high-resistance state (OFF state), so that the voltage across the device discretely increases by $\Delta V$.

The present invention lies in a fact that, when the voltage applied across the series-connected circuit of these devices is increased up to a predetermined maximum voltage value $V_{max}$, the devices sequentially switch in the ascending order of the peak currents as the current flowing through the entire series-connected circuit increases.

The total number of devices constituting the series circuit is defined as P and the number of devices to switch is defined as N. N is determined in advance in accordance with the maximum voltage value $V_{max}$.

In the present invention, the series circuit has devices capable of controlling the peak current values. Therefore, the relationship between the magnitudes of the peak current values can be changed in accordance with the input value. For this reason, the combination of the N devices to switch can be selected from the P devices in accordance with the input value.

The combination of the devices to be selected in accordance with the input value can be determined by setting a change in peak current value of each device in advance with respect to the input value.

In the present invention, an output terminal is extracted from the connection portion of the series-connected devices. Therefore, when the number of devices arranged between the output terminal and the ground terminal is defined as L, L+1 discrete voltage values $V_{out}$ can be obtained in principle as multiple-valued outputs, including a state wherein all the devices do not switch. However, since the number N of devices which can actually switch is determined in accordance with the maximum voltage value $V_{max}$, the voltage at the output terminal applied with the maximum voltage value $V_{max}$ can be obtained as M+1 multiple-valued outputs which are determined by the number M ($\leq \min(L, N)$) of switching devices of the L devices.

As described above, according to the present invention, when the maximum voltage value $V_{max}$ is applied to P series-connected devices, the N devices determined in accordance with the input value switch. If, of the N devices, K devices are included in the L devices arranged between the output terminal and the ground terminal, multiple-valued outputs almost equal to $K\Delta V$ can be extracted from the output terminal.

In addition, since relationships can be set between the magnitudes of the different peak current values in accordance with a plurality of input values, the relationship between the plurality of input values and K can be designed in advance, and this will be described later in detail.

As described above, according to the present invention, a multiple-valued logic circuit capable of realizing a large number of functions can be constituted with a small number of devices and a small number of different kinds of devices.

The embodiments of the present invention will be described below with reference to the accompanying drawings.

First Embodiment

FIG. 1 shows the arrangement of a multiple-valued logic circuit according to the first embodiment of the present invention. In this case, six devices are connected in series.

Referring to FIG. 1, reference numeral 1 denotes a series circuit representing the multiple-valued logic circuit of the first embodiment; DD1 to DD3, two-terminal devices each consisting of a resonant-tunneling diode; TD1 to TD3, three-terminal devices (resonant-tunneling three-terminal devices) each consisting of a resonant-tunneling device with a control terminal; 2, a power supply terminal to which an alternating voltage (or an alternating current) VDA oscillating between voltage values V1 and V2 over time is supplied; T1, a signal input terminal to which a control voltage VG is supplied; T2, a signal output terminal; 3, a ground terminal to be paired with the power supply terminal 2; and S, an alternating voltage source connected between the power supply terminal 2 and the ground terminal to output the alternating voltage VDA.

Each of the two-terminal devices DD1 to DD3 and the three-terminal devices TD1 to TD3 has a first main terminal a and a second main terminal b and exhibits voltage-current characteristics including negative differential resistance characteristics for obtaining a peak current value Ip as shown in FIG. 2.

Each of the three-terminal devices TD1 to TD3 has a control terminal c in addition to the first and second main terminals a and b and has characteristics representing that the peak current value Ip shown in FIG. 2 changes in accordance with the control voltage VG applied to the control terminal c, as shown in FIG. 3. Such a three-terminal device is described in the following references: M. W. Dellow, P. H. Beton, M. Henini, P. C. Main, L. Eaves, S. P. Beaumont, and C. D. W. Wilkinson, "Gated resonant tunneling devices," Electron. Lett, 27(2), pp. 134–136 (1991); and K. Maezawa and T. Mizutani, "A new resonant tunneling logic gate employing monostable-bistable transition," Jpn. J. Appl. Phys. Pt. 2, 23 (1A–B), pp. L42–44 (1993).

In the present invention, q devices having the negative differential resistance characteristics are connected in series, and m resonant-tunneling diodes and n resonant-tunneling three-terminal devices are used, where q=m+n (m is an integer of 1 or more, and n is an integer of 2 or more). In the first embodiment shown in FIG. 1, m=3, and n=3.

In stead of the resonant-tunneling devices, negative differential resistance diodes with the CMOS structure (Japanese Patent Laid-Open No. 7-30130) constituted by n-channel MOSFETs and p-channel MOSFETs may be used as the devices DD1 to DD3 and the three-terminal devices TD1 to TD3.

FIG. 4 shows an example of the above-described three-terminal device. Referring to FIG. 4, reference numeral 11 denotes a semi-insulating GaAs substrate having a major surface consisting of a (100) plane; 12, an n$^+$-GaAs film formed to have a thickness of about 300 nm; 13, an n-GaAs film formed to have a thickness of about 300 nm; 14, an undoped AlAs film formed to have a thickness of about 2 nm; 15, an undoped GaAs film formed to have a thickness of about 5 nm; 16, an undoped AlAs film formed to have a thickness of about 2 nm; 17, an n-GaAs film formed to have a thickness of about 300 nm; and 18, an n$^+$-GaAs film formed to have a thickness of about 50 nm.

Reference numeral 19 denotes a drain electrode formed on the exposed GaAs film 12 and consisting of AuGe/Ni serving as the second main terminal b; 20, a gate electrode formed on a thin exposed region of the GaAs film 17 and consisting of Ni/Zn serving as the control terminal c; and 21, a source electrode formed on the GaAs film 18 and consisting of AuGe/Ni serving as the first main terminal a.

A p-type region 22 is formed by diffusing Zn in a region under the gate electrode 20. The layers on the GaAs substrate 11 are formed as a thin multilayered structure by molecular beam epitaxy. By the known wet-etching process, the shape of each layer and impurity doping regions are formed. The electrodes having an ohmic contact are formed by the lift-off process.

In the above arrangement, peak current values Ip1 to Ip6 of the devices DD1 to DD3 and the three-terminal devices TD1 to TD3 are set as shown in Table 1 while the peak current value Ip4 of the three-terminal device TD1 is standardized as a reference value of "1".

Note that the three-terminal devices TD1 to TD3 are not controlled by the control voltage VG.

TABLE 1

| Peak Current of Device | Standardized Peak Current Value |
|---|---|
| Ip1 of DD1 | 5 |
| 1p2 of DD2 | 6 |
| 1p3 of DD3 | 7 |
| 1p4 of TD1 | 1 |
| 1p5 of TD2 | 2 |
| 1p6 of TD3 | 3 |

As described above, the alternating voltage VDA which alternately takes zero voltage or the relatively low voltage value V1 and the voltage value V2 higher than the voltage value V1 is applied to the power supply terminal 2, as shown in FIG. 5.

A common signal is supplied from the signal input terminal T1 to the control terminals c of the three-terminal devices TD1 to TD3. The power supply terminal 2 is connected between the device DD3 and the three-terminal device TD1.

Regarding the two-terminal devices DD1 to DD3 as load circuits (DD loads) and the three-terminal devices TD1 to TD3 as drive circuits (TD drivers), the voltage-current characteristics as shown in FIG. 6 are obtained. Assume that the power supply voltage V2 is supplied from the voltage source S to the power supply terminal 2. The six series-connected devices have almost the same valley voltage V$_v$, and the voltage value V2 is set to be almost three times the valley voltage V$_v$.

With this setting, when the power supply voltage is V2, of the six series-connected devices constituting the series-connected circuit 1, three devices with lower peak current densities switch from the ON state to the OFF state.

For this reason, in the above drive circuit, the voltage-current characteristics as indicated by a solid line in FIG. 6 are obtained. In the above load circuit, voltage-current characteristics as indicated by a dotted line in FIG. 6 are obtained. That is, in the multiple-valued logic circuit in FIG. 1, output voltages in four states, i.e., "0", "1", "2", and "3" are obtained.

When a change amount a of the peak current value Ip according to the voltage-current characteristics of the three-terminal devices TD1 to TD3 (drive circuit) is used as a parameter, the voltage at the signal output terminal T2 changes with respect to the voltage VDA applied to the power supply terminal 2, as shown in FIG. 7.

While the voltage V2 is kept applied to the power supply terminal 2, a relationship as shown in FIG. 8 is established between the voltage at the power supply terminal 2 and the change amount α. As shown in FIG. 9, when a voltage which increases from zero at a constant change rate is applied to the signal input terminal T1, the peak current values Ip4 to Ip6 of the three-terminal devices TD1 to TD3 respectively change from the standardized values of 1, 2, and 3 by the change amount α.

Figure 9A:
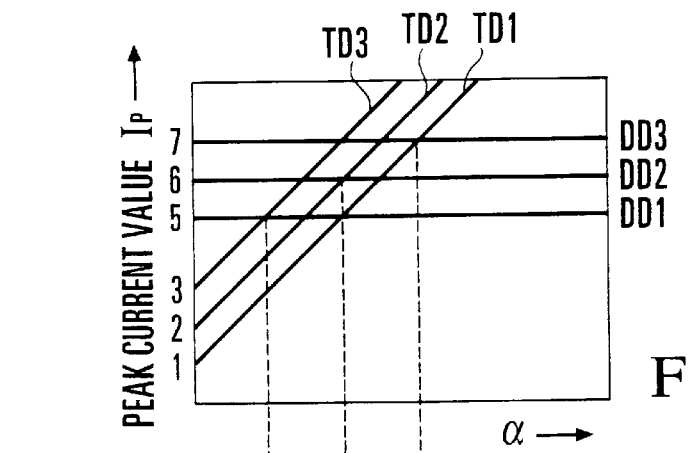
FIGS. 9A and 9B are graphs showing the function of the multiple-valued logic circuit of the first embodiment.

As shown in FIG. 9A, when the value α is 2 or more, the peak current value Ip6 of the three-terminal device TD3 becomes larger than the peak current value Ip1 of the device DD1. When the value α is 4 or more, the peak current value Ip5 of the three-terminal device TD2 becomes larger than the peak current value Ip2 of the device DD2. When the value α is 6 or more, the peak current value Ip4 of the three-terminal device TD1 becomes larger than the peak current value Ip1 of the device DD3.

Therefore, when the alternating voltage VDA is applied to the power supply terminal 2, each device can switch as will be described below. The alternating voltage VDA alternately takes the voltage value V1, the voltage value 3V$_v$ which is three times the valley voltage shown in FIG. 2, and the voltage value V2 slightly larger than the voltage value 3V$_v$.

When 0<α<2, the three-terminal devices TD1 to TD3 of the series-connected circuit 1 switch from the ON state to the OFF state.

When 2<α<4, the device DD1 and the three-terminal devices TD1 and TD2 switch from the ON state to the OFF state.

When 4<α<6, the devices DD1 and DD2 and the three-terminal device TD1 switch from the ON state to the OFF state.

Figure 9B:
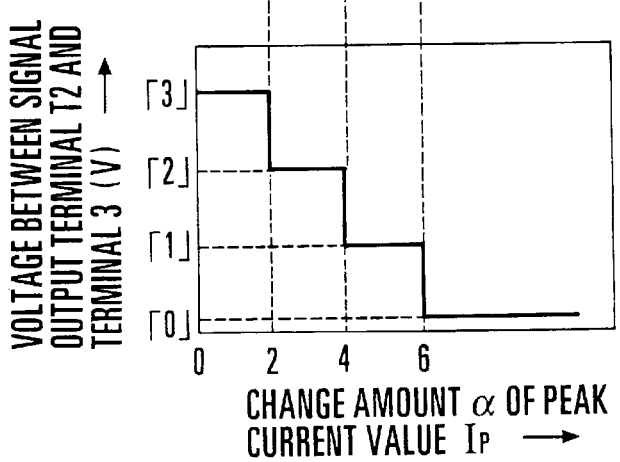

Therefore, when four values of "0", "1", "2", and "3" are considered, a value of "3" is obtained from the signal output terminal T2 when 0<α<2, a value of "2" is obtained when 2<α<4, a value of "1" is obtained when 4<α<6, and a value of "0" is obtained when 6<α, as shown in FIG. 9B.

As described above, according to the multiple-valued logic circuit of the first embodiment, an output signal with one of the four voltage values can be obtained in accordance with an input signal voltage value V1 applied to the signal input terminal T1, so that a function as a multiple-valued logic circuit can be obtained.

The multiple-valued logic circuit of the first embodiment uses no general-purpose switching devices such as a MOSFET, as shown in FIG. 1. Instead, only devices having voltage-current characteristics including differential negative resistance characteristics are used.

For this reason, the multiple-valued logic circuit can be more easily manufactured with a simpler structure than the conventional multiple-valued logic circuit as shown in FIG. 46.

Second Embodiment

Figure 10:
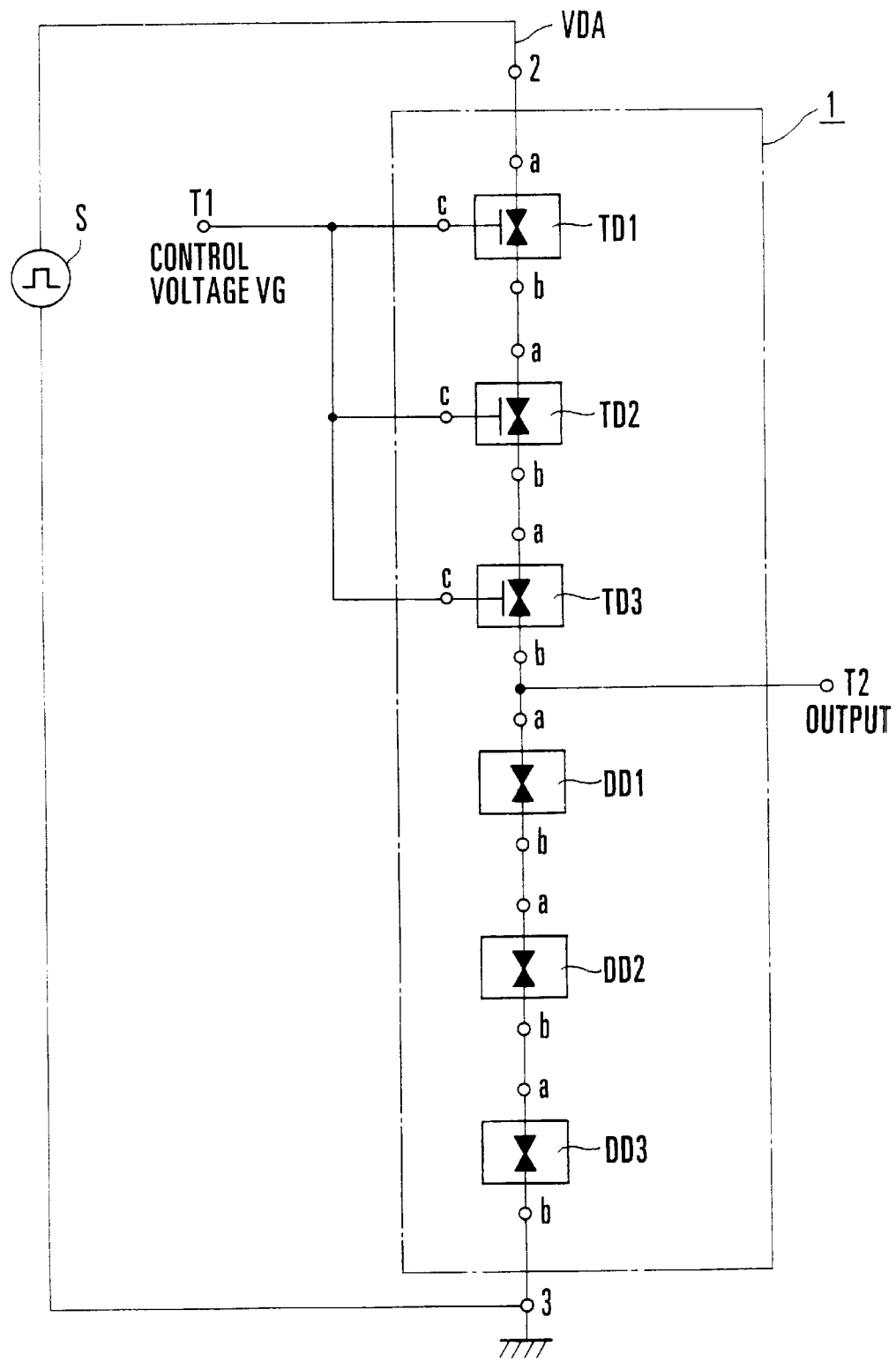
FIG. 10 is a circuit diagram showing the arrangement of a multiple-valued logic circuit according to the second embodiment of the present invention.

FIG. 10 shows the arrangement of a multiple-valued logic circuit according to the second embodiment of the present invention. The second embodiment has almost the same arrangement as that of the first embodiment. However, as shown in FIG. 10, three-terminal devices TD1 to TD3 are arranged on a power supply terminal 2 side. In this case, a signal output terminal T2 is extracted from a portion between the three-terminal device TD3 and a device DD1.

Figure 11A:
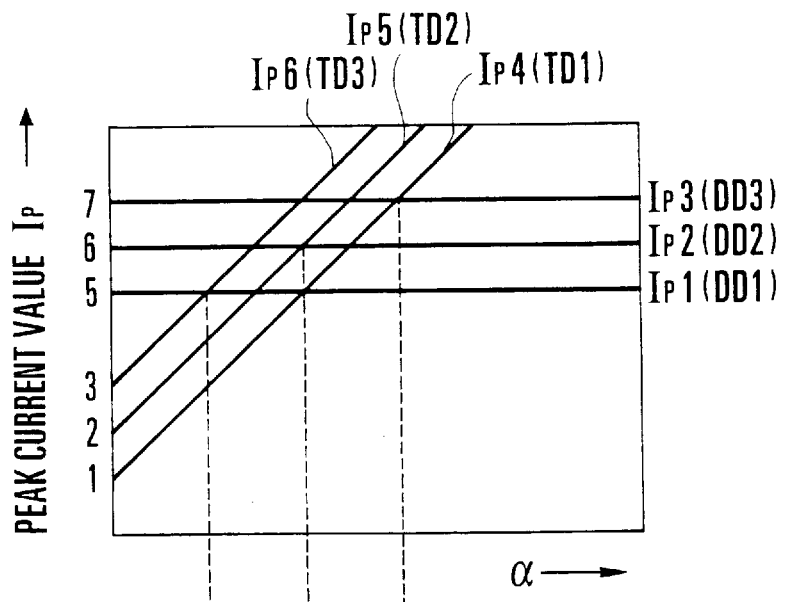
FIGS. 11A and 11B are graphs showing the function of the multiple-valued logic circuit of the second embodiment.
Figure 11B:
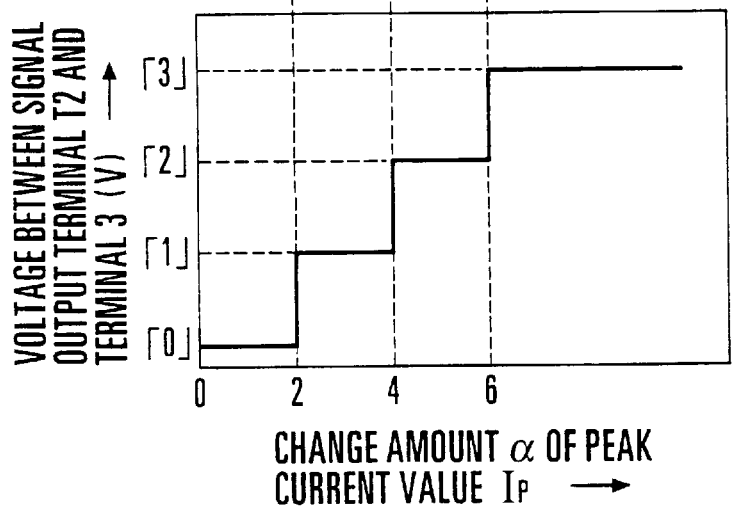

With this arrangement as well, a function as a multiple-valued logic circuit as shown in FIGS. 11A and 11B can be obtained, as in the first embodiment (FIGS. 9A and 9B).

Third Embodiment

Figure 12:
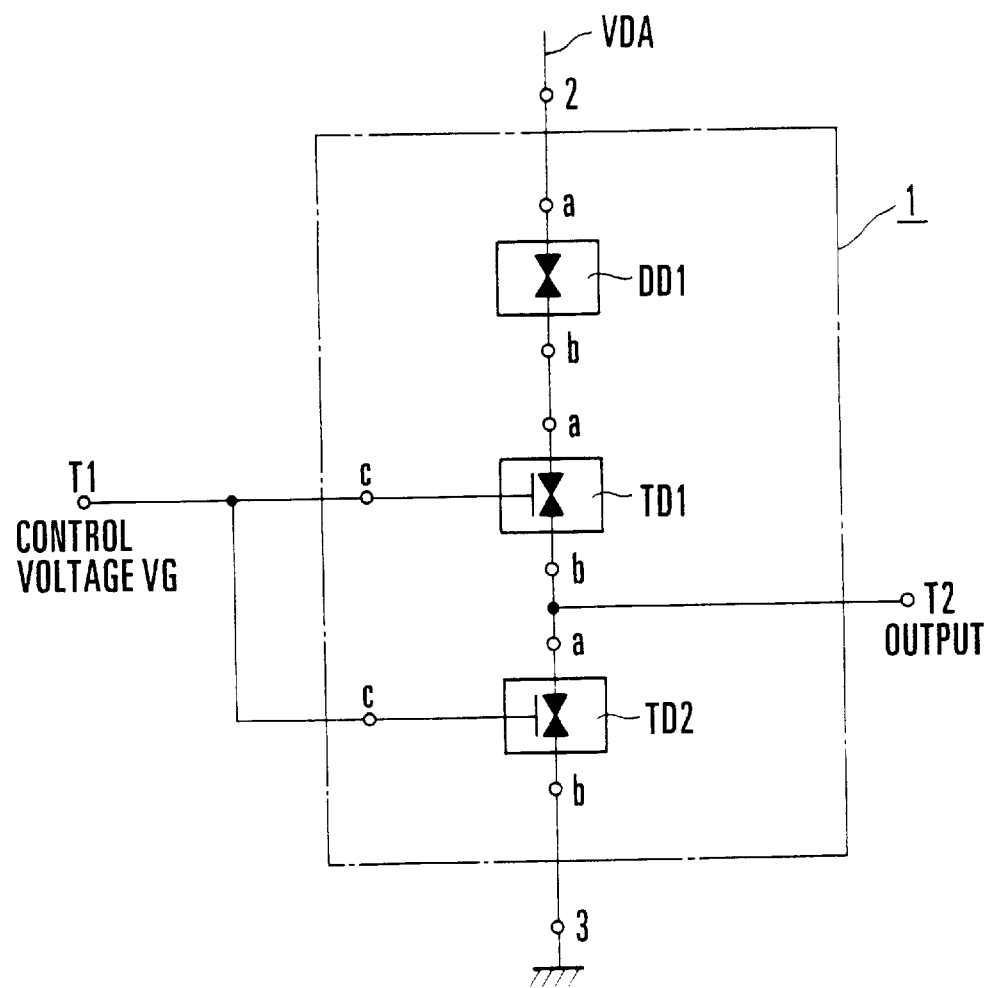
FIG. 12 is a circuit diagram showing the arrangement of a multiple-valued logic circuit according to the third embodiment of the present invention.

FIG. 12 shows the arrangement of a multiple-valued logic circuit according to the third embodiment of the present invention. In the third embodiment, q=3, m=1, n=2, and j=2. In a series circuit 1, a first main terminal a of a device DD1 is connected to a power supply terminal 2, a first main terminal a of a three-terminal device TD1 is connected to a main terminal b of the device DD1, a main terminal a of a three-terminal device TD2 is connected to a main terminal b of the three-terminal device TD1, and a ground terminal 3 is connected to a main terminal b of the three-terminal device TD2. Note that the definition of j is that the connection portion from which the output terminal is extracted is set between the jth unit device and the (j+1)th unit device.

Control terminals c of the three-terminal devices TD1 and TD2 are connected to a signal input terminal T1. The signal output terminal is extracted from a portion between the three-terminal device TD1 and the three-terminal device TD2. The device DD1 takes a standardized value of 4 in accordance with a peak current value Ip1. Without being controlled by the control terminal c, the three-terminal device TD1 takes a standardized value of 1 in accordance with a peak current value Ip2, and the three-terminal device TD2 takes a standardized value of 2 in accordance with a peak current value Ip3.

Table 2 shows the peak current values of the two-terminal device DD1 and the three-terminal devices TD1 and TD2. As for the three-terminal devices TD1 and TD2, the change in peak current value in accordance with the input value applied to the input terminal is shown.

The peak current values are standardized on the basis of the peak current value of the three-terminal device TD1, which is observed when no signal is input to the control terminal c. $\alpha$ represents a change amount of the peak current values of the three-terminal devices TD1 and TD2 with respect to the change in gate voltage.

TABLE 2

| Peak Current of Device | Standardized Peak Current Value |
|---|---|
| Ip1 of DD1 | 4 |
| Ip2 of TD1 | $1 + 2\alpha$ |
| Ip3 of TD2 | $2 + \alpha$ |

Figure 13:
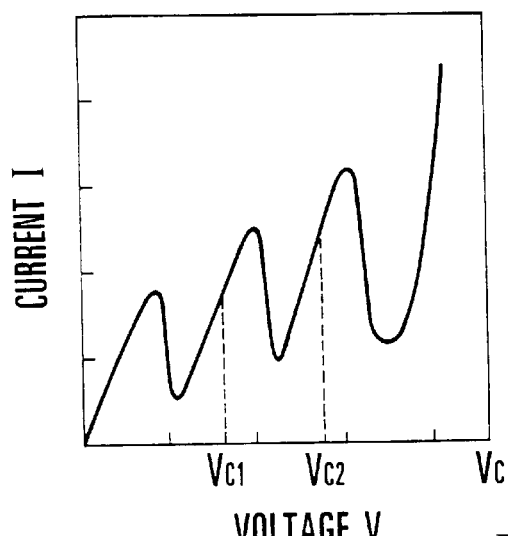
FIG. 13 is a graph showing the voltage-current characteristics of the multiple-valued logic circuit of the third embodiment using three resonant-tunneling devices shown in Table 2.

FIG. 13 shows the current-voltage characteristics of the multiple-valued logic circuit of the third embodiment using the three resonant-tunneling devices. The three devices DD1, TD1, and TD2 have almost the same valley voltage $V_v$, and Vc1 is set at a value slightly larger than the valley voltage $V_v$, as shown in FIG. 13. With this setting, when VDA is Vc1, the three series-connected devices, only one with the smallest peak current value switches.

Figure 14A:
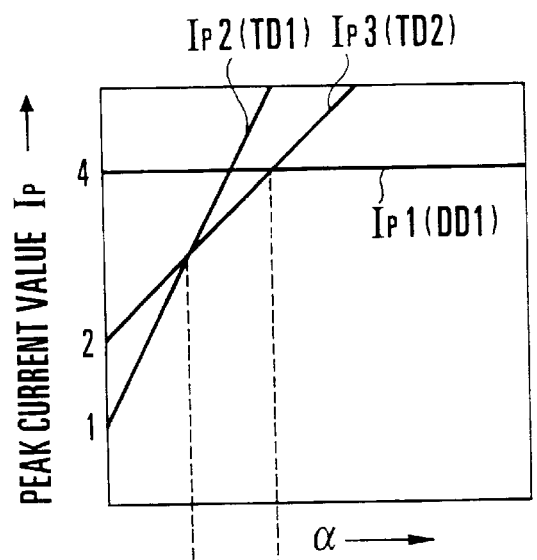
FIGS. 14A and 14B are graphs showing the function of the multiple-valued logic circuit of the third embodiment.
Figure 14B:
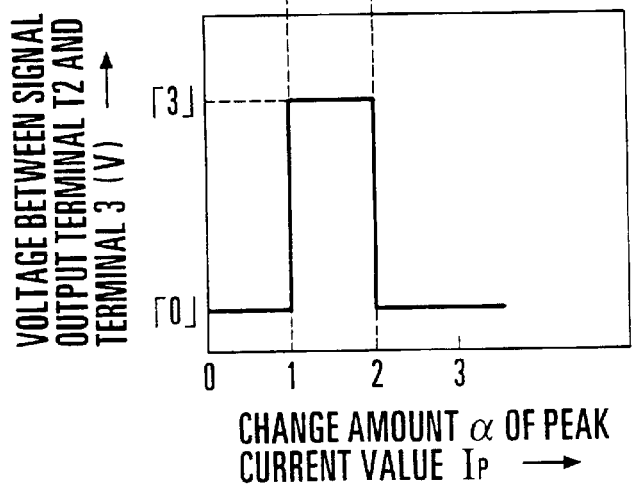

FIGS. 14A and 14B show changes in peak current values of the three-terminal devices TD1 and TD2, which are observed when the input signal voltage to the control terminal c increases from zero. Referring to FIGS. 14A and 14B, as the input signal voltage increases, the peak current values Ip2 and Ip3 of the three-terminal devices TD1 and TD2 gradually increase to be larger than the peak current value Ip1 of the device DD1. In addition, as shown in Table 2, the change amount for the three-terminal device TD1 is twice that for the three-terminal device TD2. Therefore, when the signal voltage to the signal input terminal T1 increases from zero, and $\alpha=1$, the relationship between the magnitudes of the peak current value Ip2 of the three-terminal device TD1 and the peak current value Ip3 of the three-terminal device TD2 is reversed.

When the gate voltage further increases, and $\alpha=2$, the relationship between the magnitudes of the peak current value of the device TD2 and that of the device DD1 is reversed. While the voltage applied to the power supply terminal 2 is increasing from V1 to V2 (=Vc1), the three-terminal device TD1 switches when $0<\alpha<1$. The three-terminal device TD2 switches when $1<\alpha<2$, and the device DD1 switches when $2<\alpha$.

Therefore, in the devices arranged between the output terminal T2 and the ground terminal 3, the number of devices to switch is zero when $0<\alpha<1$, one when $1<\alpha<2$, and zero again when $2<\alpha$. As a result, an output obtained from the output terminal T2 is "0" when $0<\alpha<1$, "3" when $1<\alpha<2$, and "0" when $2<\alpha$, as shown in FIGS. 14A and 14B.

In this manner, a four-valued literal logic circuit operation can be realized using one resonant-tunneling diode and two resonant-tunneling three-terminal devices. Instead of the resonant-tunneling diode, a resonant-tunneling three-terminal device can be used, as a matter of course.

The number and kinds of devices largely decrease as compared to the prior art. In addition, this circuit can be manufactured using the multilayered structure used to manufacture a conventional resonant-tunneling diode and the same processes as for a conventional heterojunction bipolar transistor.

In the third embodiment, the threshold values of the logic circuit are set to 1 and 2. However, when the peak current values of the respective devices are appropriately set, arbitrary values can be set, as a matter of course.

Fourth Embodiment

Figure 15A:
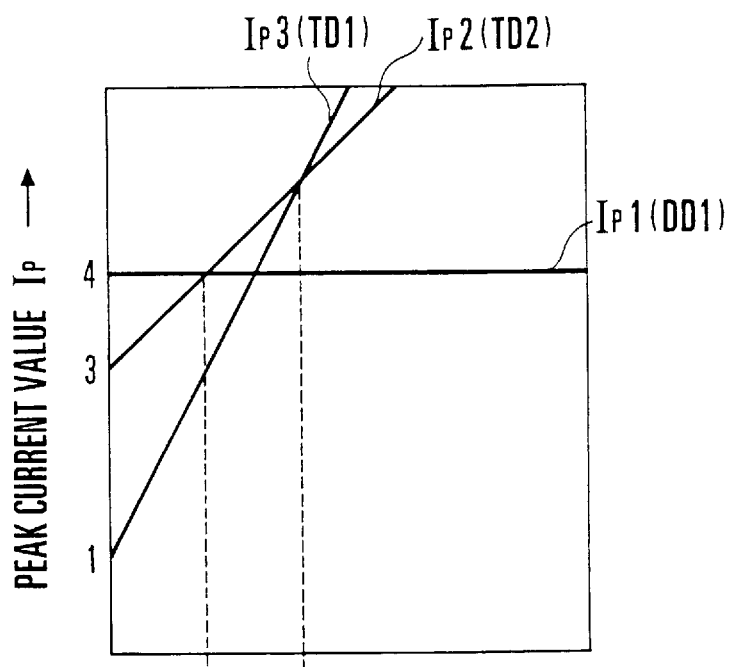
FIGS. 15A and 15B are graphs showing the function of the multiple-valued logic circuit of the fourth embodiment.
Figure 15B:
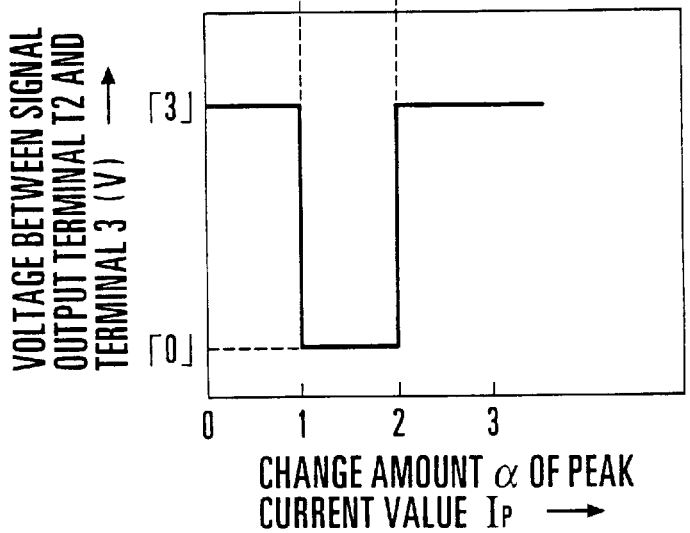

In the third embodiment, when the peak current values of the device DD1 and the three-terminal devices TD1 and TD2 are set as shown in Table 3, output characteristics as shown in FIGS. 15A and 15B can be obtained.

TABLE 3

| Peak Current of Device | Standardized Peak Current Value |
|---|---|
| Ip1 of DD1 | 4 |
| Ip2 of TD1 | $1 + 2\alpha$ |
| Ip3 of TD2 | $3 + \alpha$ |

As shown in FIGS. 15A and 15B, in this fourth embodiment as well, as the signal voltage applied to a signal input terminal T1 increases, peak current values Ip2 and Ip3 of three-terminal devices TD1 and TD2 gradually increase to become larger than a peak current value Ip1 of a device DD1. The change amount for the three-terminal device TD1 is set to be twice that for the three-terminal device TD2.

Therefore, when the input signal voltage increases from zero, and α=1, the relationship between the magnitude of the peak current value of the device DD1 and that of the three-terminal device TD2 is reversed. When the input signal voltage further increases, and α=2, the relationship between the magnitude of the peak current value of the three-terminal device TD1 and that of the three-terminal device TD2 is reversed. While the voltage applied to the power supply terminal 2 is increasing from V1 to V2 (=Vc2), the three-terminal devices TD1 and TD2 switch when 0<α<1. The device DD1 and the three-terminal device TD1 switch when 1<α<2, and the device DD1 and the three-terminal device TD2 switch when 2<α. Therefore, in the devices arranged between the output terminal T2 and the ground terminal 3, the number of devices to switch is one when 0<α<1, zero when 1<α<2, and one again when 2<α.

As a result, an output obtained from the output terminal is "3" when 0<α<1, "0" when 1<α<2, and "3" when 2<α, as shown in FIGS. 15A and 15B.

In the above-described first to fourth embodiments, a resonant-tunneling three-terminal device is used as a three-terminal device. However, the present invention is not limited to this.

Fifth Embodiment

FIG. 16 shows the arrangement of a multiple-valued logic circuit according to the fifth embodiment of the present invention. Referring to FIG. 16, devices TD1a to TD3a are three-terminal devices each consisting of a resonant-tunneling diode and an enhancement type FET. The remaining arrangement is the same as in FIG. 1.

The three-terminal device TD1a has an arrangement in which the drain of the FET is connected to one terminal of the resonant-tunneling diode and the source is connected to the other terminal. A signal input terminal T1 is connected to the gate of the FET. The FETs of the three-terminal devices TD1a to TD3a have transconductances equal to each other.

In each of the three-terminal devices TD1a to TD3a with the above arrangement, a peak current value Ip changes in accordance with a control voltage VG applied to a control terminal c, as shown in FIG. 17.

Therefore, the three-terminal devices TD1a to TD3a have the same characteristics as those of the three-terminal devices TD1 to TD3 in FIG. 1. With the multiple-valued logic circuit shown in FIG. 16 as well, the same effect as in the first embodiment can be obtained by appropriately setting the transconductances of the FETs of the three-terminal devices TD1a to TD3a in advance.

Sixth Embodiment

FIG. 18 shows the arrangement of a multiple-valued logic circuit according to the sixth embodiment of the present invention.

In this embodiment, the circuit of the second embodiment shown in FIG. 10 is constituted using three-terminal devices each consisting of a resonant-tunneling diode and an FET, as in the fifth embodiment.

Therefore, in the sixth embodiment as well, the same effect as in the second embodiment can be obtained by appropriately setting the transconductances of the FETs of three-terminal devices TD1a to TD3a in advance.

Seventh Embodiment

As in the fifth and sixth embodiments, the logic circuit shown in the third or fourth embodiment may be constituted using three-terminal devices each consisting of a resonant-tunneling diode and an FET.

FIG. 19 shows the arrangement of a multiple-valued logic circuit according to the seventh embodiment of the present invention. Referring to FIG. 19, each of three-terminal devices TD1a and TD2a consists of a resonant-tunneling diode and an enhancement type FET, as in the fifth and sixth embodiments.

In this case, when the transconductance of the FET of the three-terminal device TD1a and that of the FET of the three-terminal device TD2a are set at different desired values, the same effect as in the third and fourth embodiments can be obtained.

Eighth Embodiment

Figure 20:
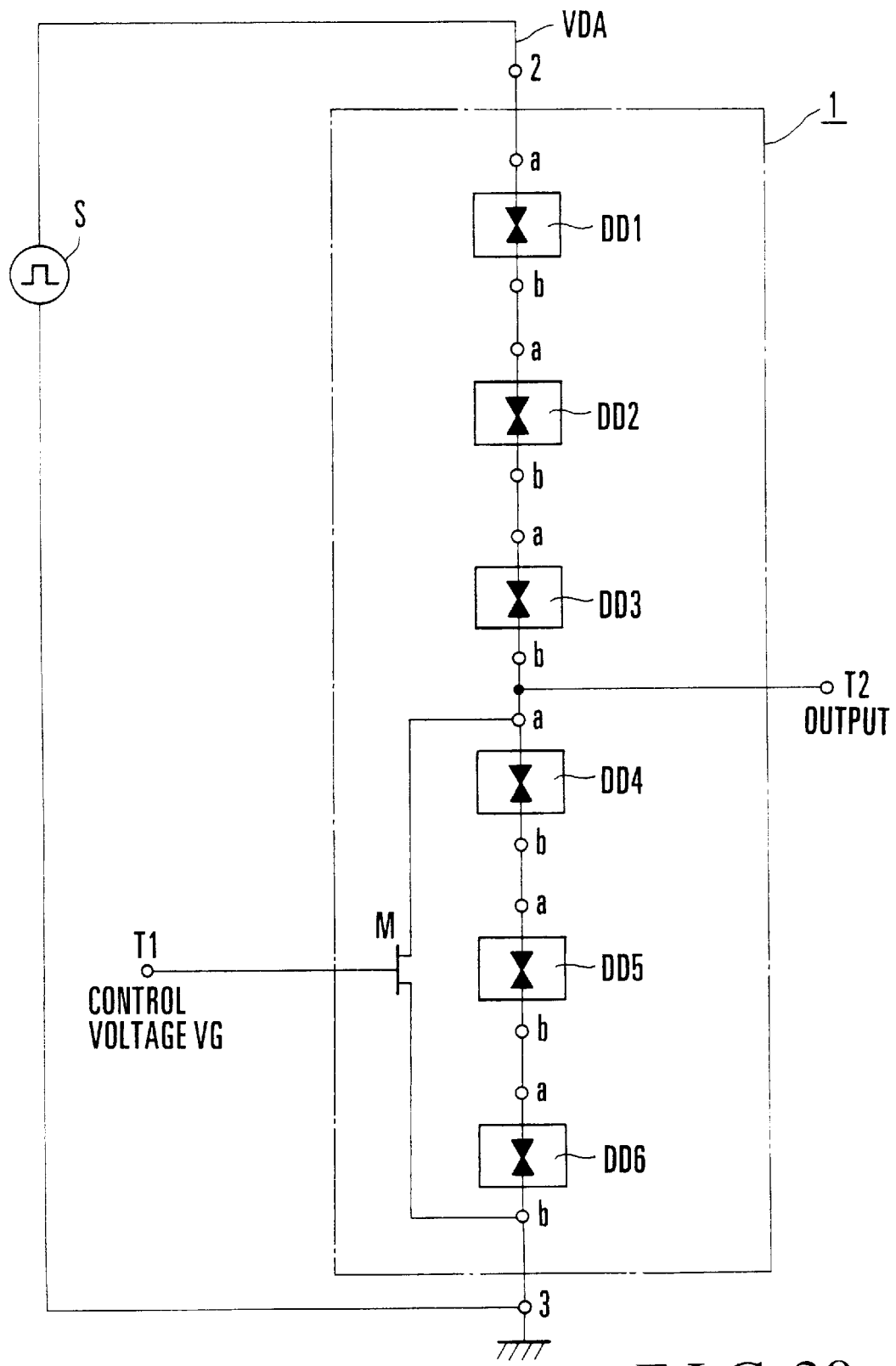
FIG. 20 is a circuit diagram showing the arrangement of a multiple-valued logic circuit according to the eighth embodiment of the present invention.

FIG. 20 shows the arrangement of a multiple-valued logic circuit according to the eighth embodiment of the present invention. Referring to FIG. 20, reference symbols DD4 to DD6 denote two-terminal devices each consisting of a resonant-tunneling diode; and M, a transistor as a three-terminal device consisting of an enhancement type FET. The devices DD4 to DD6 are connected in series with devices DD1 to DD3 on the device DD3 side. The series structure of the devices DD4 to DD6 is connected in parallel to the transistor M. The drain of the transistor M is connected to a power supply terminal 2 side, and the source is connected to a terminal 3 side.

The gate of the transistor M is connected to a signal input terminal T1. The remaining reference numerals and symbols in FIG. 20 are the same as in FIG. 1.

In this arrangement, the current flowing through the transistor M causes a change corresponding to α shown in FIGS. 9A and 9B in accordance with an input voltage applied to the gate of the transistor M. Therefore, a multiple-valued circuit (four-valued inverted circuit) similar to that of the first embodiment is realized.

With this arrangement as well, a multiple-valued logic circuit can be realized with a much smaller number of devices than that of the prior art.

Ninth Embodiment

In the eighth embodiment, the same effect as in the first embodiment can be obtained. The same effect as in the second embodiment can also be obtained with a multiple-valued logic circuit shown in FIG. 21.

FIG. 21 shows the arrangement of a multiple-valued logic circuit according to the ninth embodiment of the present invention. Devices DD4 to DD6 and a transistor M connected in parallel to the devices DD4 to DD6 are arranged on a power supply terminal 2 side.

With this arrangement, the same effect as in the second embodiment can be obtained.

10th Embodiment

Figure 22:
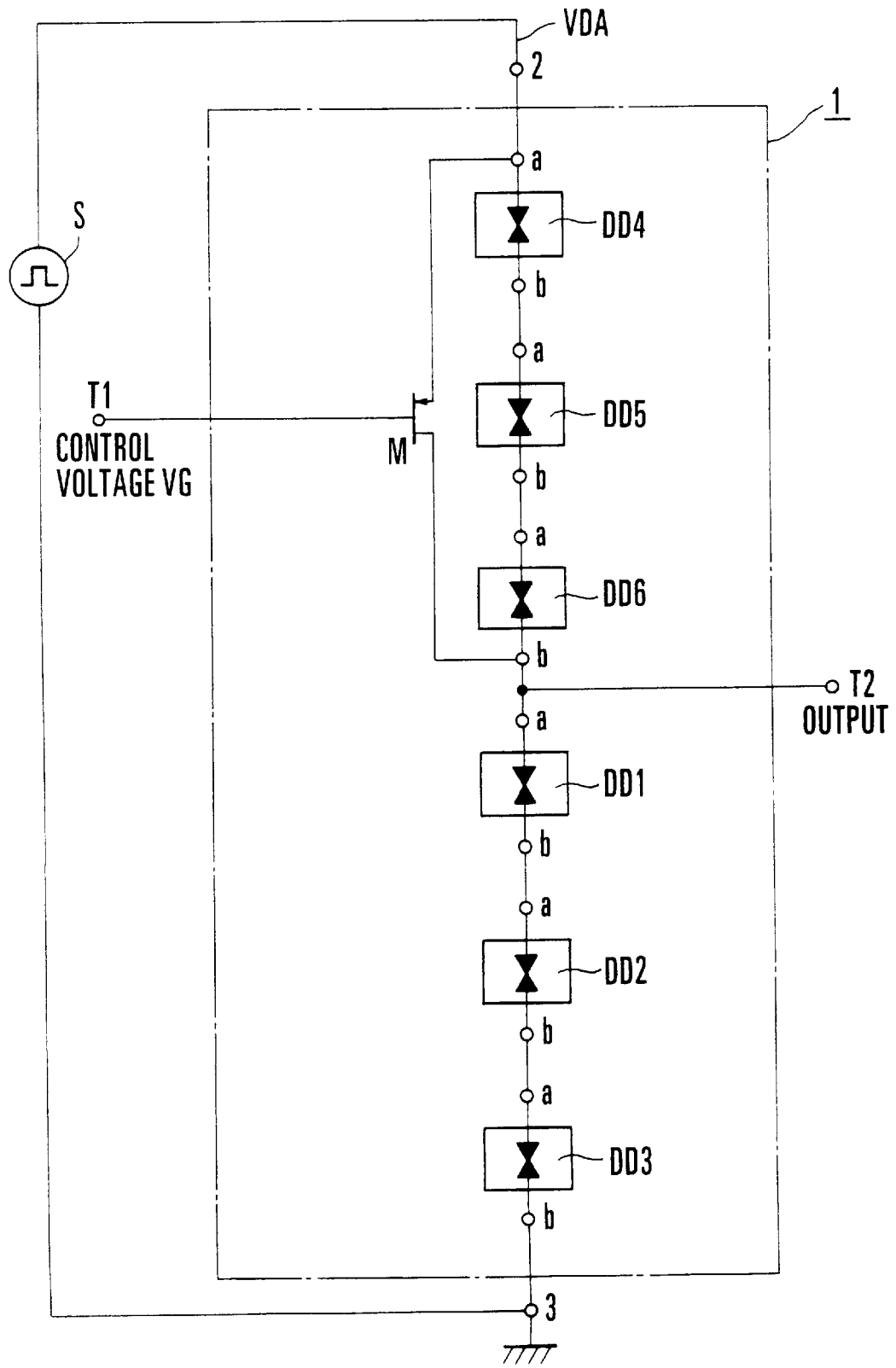
FIG. 22 is a circuit diagram showing the arrangement of a multiple-valued logic circuit according to the 10th embodiment of the present invention.

FIG. 22 shows the arrangement of a multiple-valued logic circuit according to the 10th embodiment of the present invention. A transistor M' having a channel with a p-type conductivity is connected in parallel to devices DD4 to DD6. The remaining reference numerals and symbols in FIG. 22 are the same as in FIG. 21.

The source of the transistor M' is connected to a power supply terminal 2 side while the drain is connected to a signal output terminal T2 side. For this reason, as the input signal voltage to a signal input terminal T1 increases, the peak current values corresponding to the devices DD4 to DD6 decrease. The change in peak current at this time is topologically the same as in FIGS. 9A and 9B. The peak current values change with a change α in peak current caused by an input signal input from the signal input terminal T1, as shown in FIG. 23A. An output signal output from the signal output terminal T2 changes with respect to the change α, as shown in FIG. 23B.

Therefore, according to the 10th embodiment, the same effect as in the eighth embodiment can be obtained with a different circuit.

In the above first to 10th embodiments, only one signal output terminal is arranged. However, the present invention is not limited to this, and a plurality of signal output terminals can be arranged, as will be described below.

11th Embodiment

FIG. 24 shows the arrangement of a multiple-valued logic circuit according to the 11th embodiment of the present invention.

Referring to FIG. 24, reference symbols T21 to T25 denote signal output terminals. The remaining reference numerals and symbols in FIG. 24 are the same as in FIG. 1. The signal output terminal T21 is extracted from a portion between a device DD1 and a device DD2. The signal output terminal T22 is extracted from a portion between the device DD2 and a device DD3. The signal output terminal T23 is extracted from a portion between the device DD3 and a three-terminal device TD1. The signal output terminal T24 is extracted from a portion between the three-terminal device TD1 and a three-terminal device TD2. The signal output terminal T25 is extracted from a portion between the three-terminal device TD2 and a three-terminal device TD3.

Figure 25A:
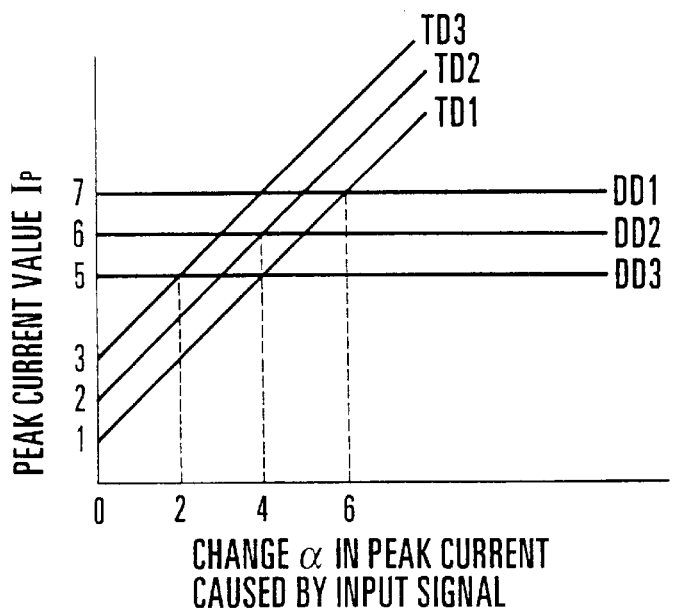
FIGS. 25A to 25C are graphs showing the function of the multiple-valued logic circuit of the 11th embodiment.

In the multiple-valued logic circuit in FIG. 24 as well, the peak current value of each device changes with a change a in peak current caused by an input signal input from a signal input terminal T1, as shown in FIG. 25A. Output signals output from the signal output terminals T21 to T25 change with the change α, as shown in FIG. 25B.

Figure 25B:
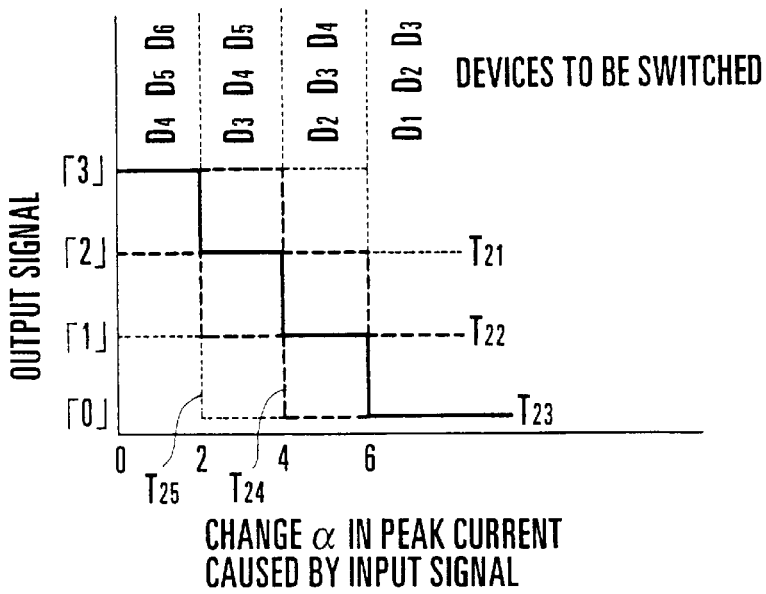
Figure 25C:
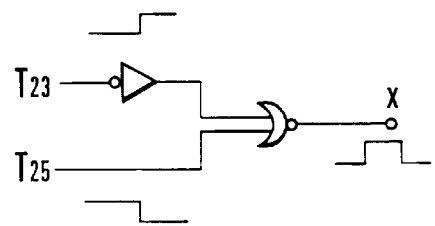

When the plurality of output patterns are combined, a literal function which goes high between 2 and 6 in FIG. 25B can be synthesized, as shown in FIG. 25C.

Alternatively, instead of the signal output terminal T23, the signal output terminal T22 or T24 is used, a signal value obtained by adding one to a value obtained from the signal output terminal T23, or a signal value obtained by subtracting one from the value obtained from the signal output terminal T23 can be automatically obtained, resulting in an advantage in circuit arrangement.

12th Embodiment

The 12th embodiment of the present invention will be described below.

In the 12th embodiment, a control terminal is added to the three-terminal device of the first embodiment, thereby arranging two control terminals.

FIG. 26 shows the arrangement of a multiple-valued logic circuit according to the 12th embodiment of the present invention. Referring to FIG. 26, each of four-terminal devices FD1 to FD3 consists of a resonant-tunneling diode having a control terminal c and a control terminal d for adjusting the threshold value. Signal input terminals TA1 to TA3 are connected to the control terminals d of the four-terminal devices FD1 to FD3, respectively.

An operation by a control signal input to the signal input terminal TA1 will be described below.

Figure 27A:
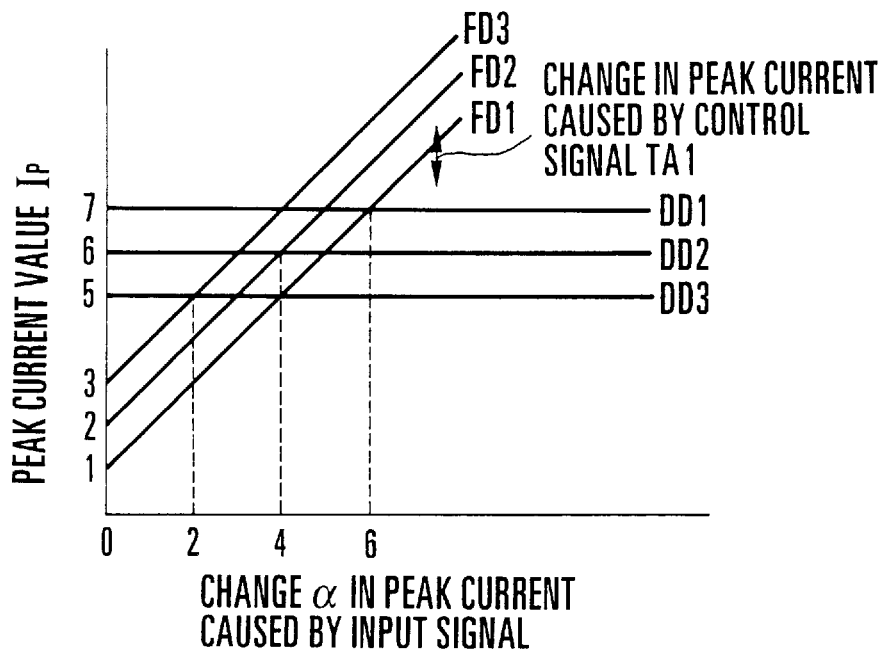
FIGS. 27A and 27B are graphs showing the function of the multiple-valued logic circuit of the 12th embodiment.

FIG. 27A shows a change in peak current value of each device in the multiple-valued logic circuit of the 12th embodiment. The change in peak current value of the four-terminal device FD1 varies in accordance with a control signal input to the signal input terminal TA1, as indicated by an arrow in FIG. 27A.

Figure 27B:
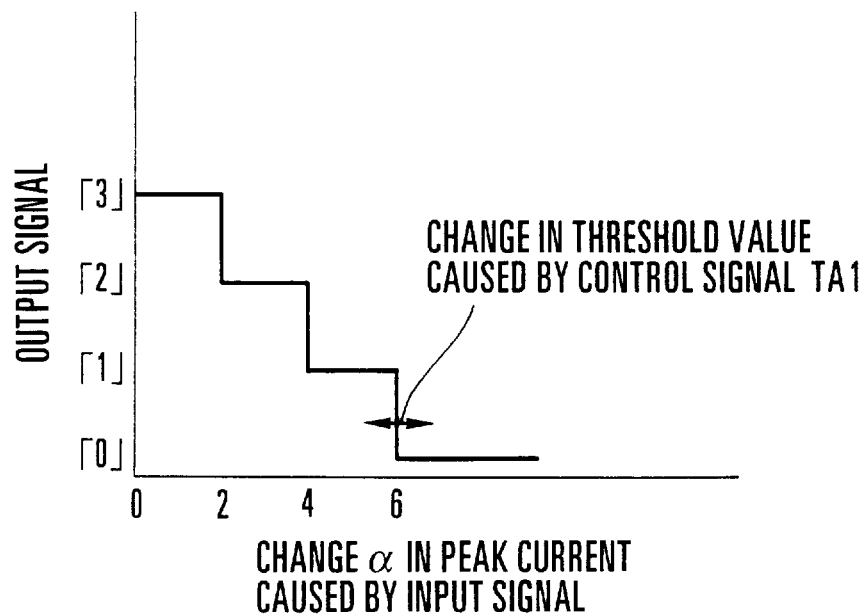

As a result, as shown in FIG. 27B, a signal output from a signal output terminal T2 changes from "1" to "0" before or after the point where α=6. More specifically, the threshold value with respect to the change from "0" to "1" can be changed in accordance with the control signal supplied to the signal input terminal TA1. This can also apply to the signal input terminals TA2 and TA3.

With this arrangement, even after the gate of the multiple-valued logic circuit is manufactured, and the circuit is mounted, the threshold value of the gate can be changed by supplying predetermined signals to the signal input terminals TA1 to TA3.

Therefore, threshold value adjustment can be performed in accordance with use conditions in an actual operation site. In addition, by inputting an output from another logic gate to this circuit, a result of some logic calculation can be used to control the threshold value.

13th Embodiment

Like the relationship between the first embodiment and the second embodiment, between the fifth embodiment and the sixth embodiment, or between the eighth embodiment and the ninth embodiment, the arrangement shown in FIG. 26 of the 12th embodiment can be modified as shown in FIG. 28, as a matter of course.

In this case, an output signal as shown in FIGS. 29A and 29B is obtained from a signal output terminal T2. As shown in FIG. 29B, a signal output from the signal output terminal T2 changes from "2" to "3" before or after the point where α=6.

In the third or fourth embodiment, the three-terminal devices may be replaced with the above-described fourth-terminal devices.

14th Embodiment

Figure 31:
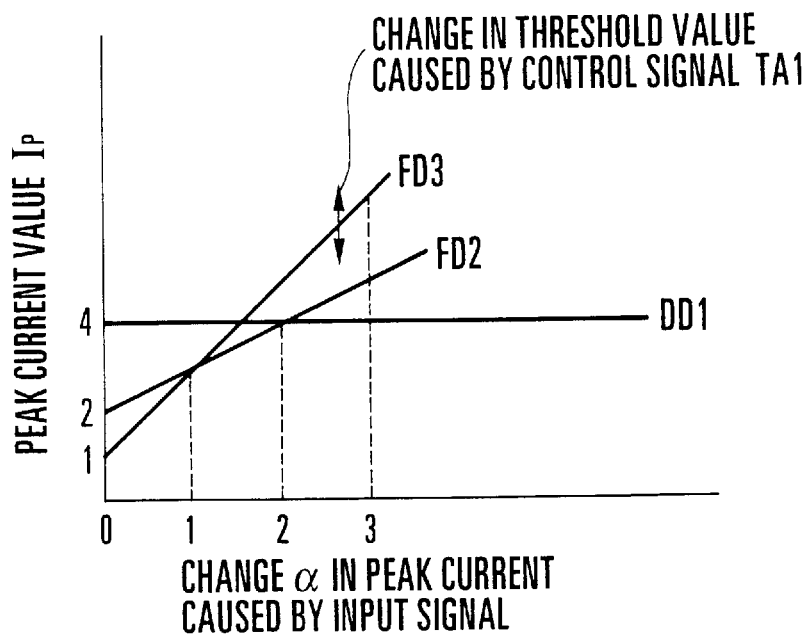
FIGS. 31A and 31B are graphs showing the function of the multiple-valued logic circuit of the 14th embodiment.
Figure 31:
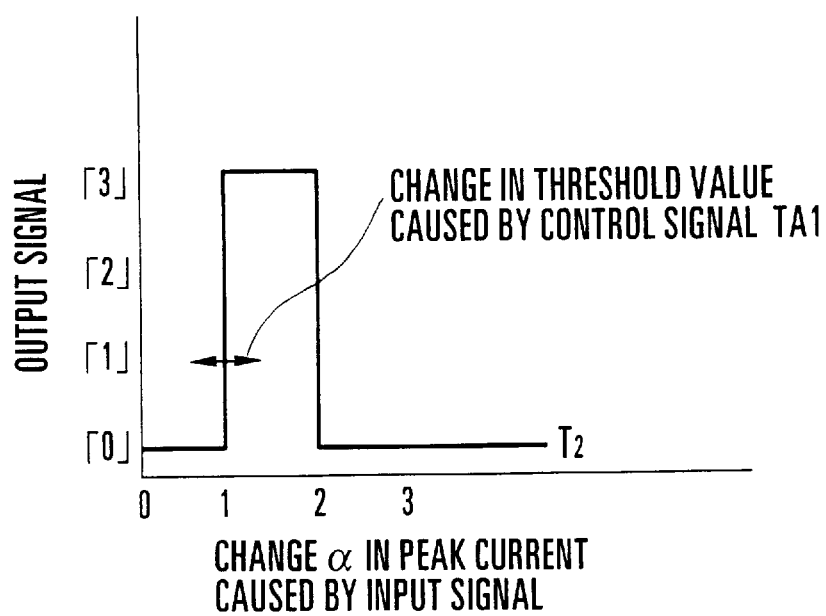

FIG. 30 shows the arrangement of a multiple-valued logic circuit according to the 14th embodiment of the present invention. For example, a change in current peak value of a four-terminal device FD1 varies in accordance with a control signal supplied to a signal input terminal TA1, as shown in FIG. 31A. As a result, a signal output from a signal output terminal T2 changes from "0" to "3" before or after the point where α=1, as shown in FIG. 31B.

15th Embodiment

In the 12th embodiment, different control signals are input to the control terminals d of the four-terminal devices FD1 to FD3. However, as shown in FIG. 32, the respective control terminals d may be connected to a signal input terminal T1'.

Figure 33:
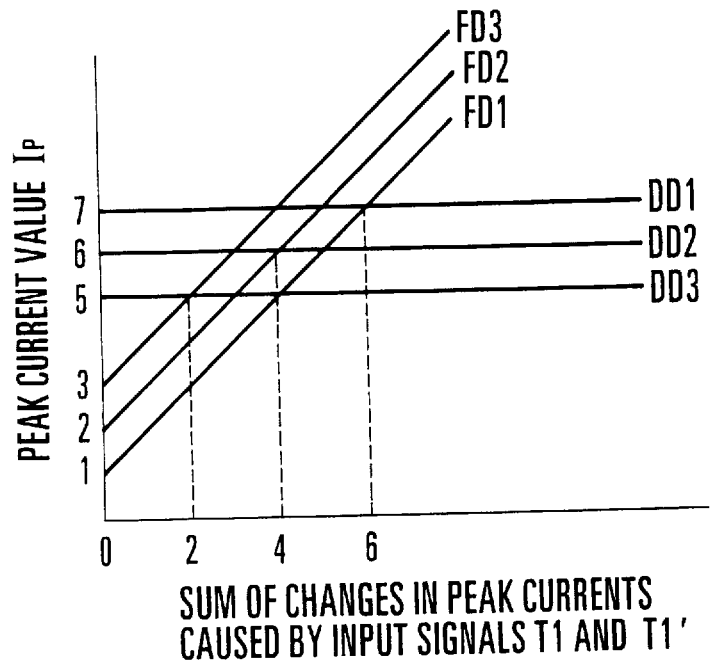
FIGS. 33A and 33B are graphs showing the function of the multiple-valued logic circuit of the 15th embodiment.
Figure 33:
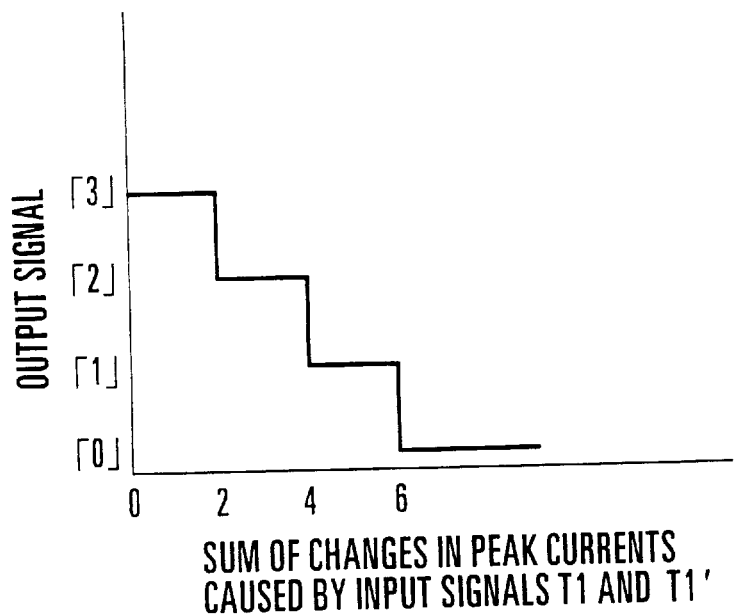

With this arrangement, characteristics as shown in FIG. 33 are obtained in a multiple-valued logic circuit of the 15th embodiment. Therefore, a multiple-valued logic operation using the linear sum of two inputs as a new input signal can be realized.

As in the 13th or 14th embodiment, this circuit can also have an arrangement as shown in FIG. 34 or 35.

16th Embodiment

Figure 36:
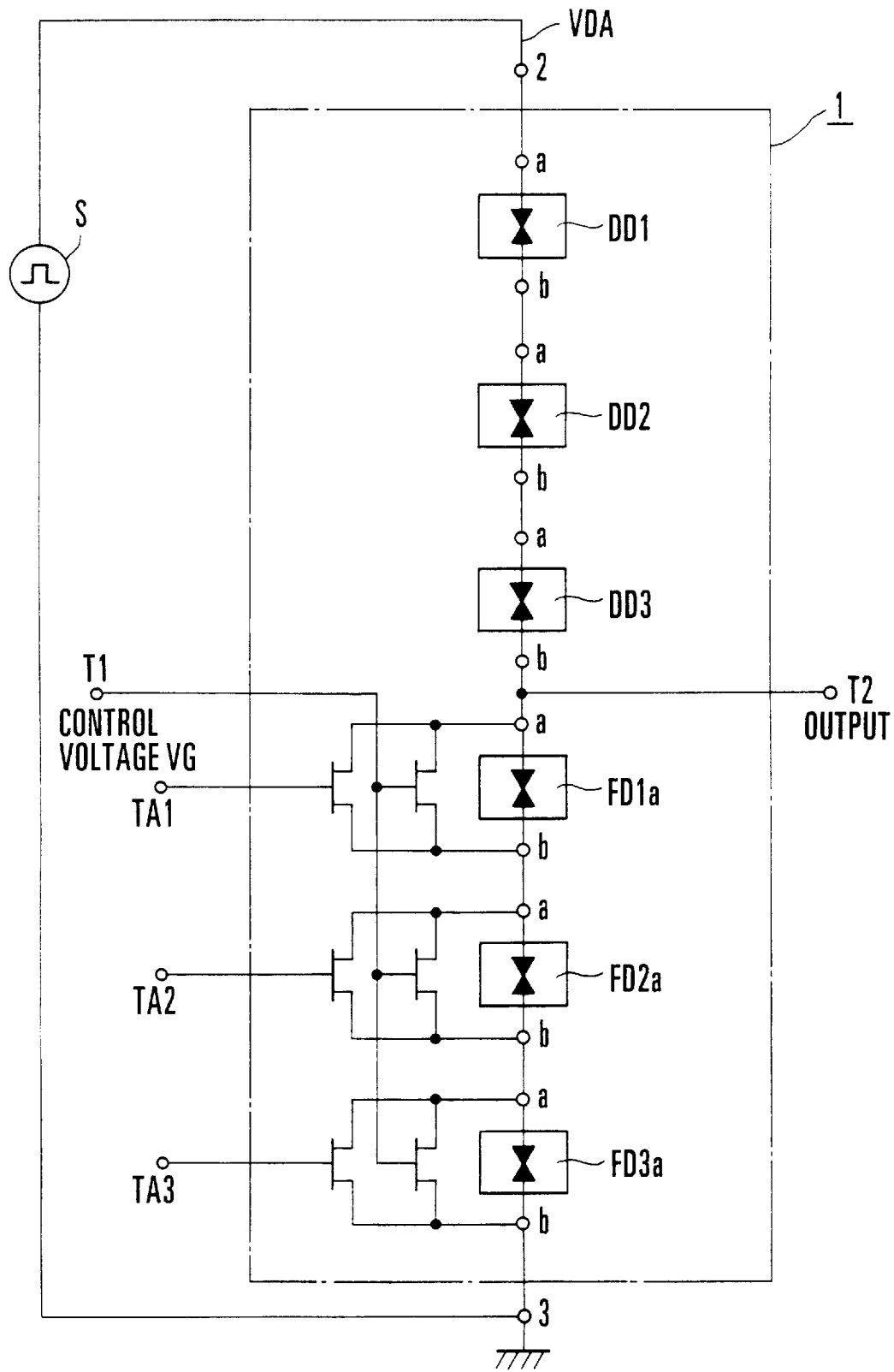
FIG. 36 is a circuit diagram showing the arrangement of a multiple-valued logic circuit according to the 16th embodiment of the present invention.

FIG. 36 shows the arrangement of a multiple-valued logic circuit according to the 16th embodiment.

Referring to FIG. 36, each of four-terminal devices FD1a to FD3a consists of a resonant-tunneling diode and two enhancement type FETs. That is, an additional FET is connected in parallel to each of the three-terminal devices TD1a to TD3a shown in FIG. 16. The remaining reference numerals and symbols as in FIG. 36 are the same as in FIG. 26. The operation is also the same as in the 12th embodiment shown in FIG. 26.

In the 13th or 14th embodiment, the four-terminal devices of the 16th embodiment may be used, as a matter of course. In this case, the circuit has an arrangement shown in FIG. 37 or 38.

17th Embodiment

Figure 39:
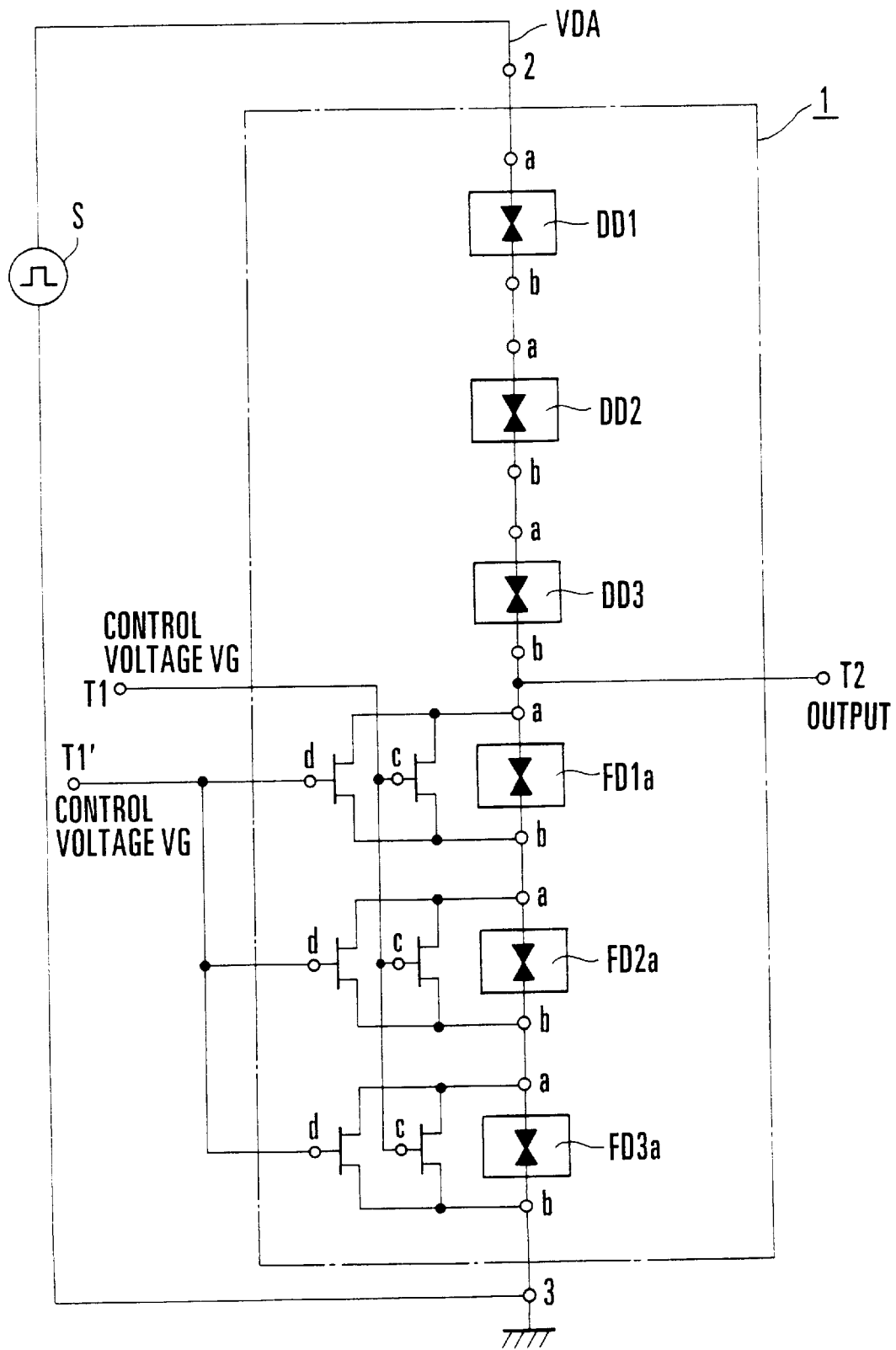
FIG. 39 is a circuit diagram showing the arrangement of a multiple-valued logic circuit according to the 17th embodiment of the present invention.

When such four-terminal devices are used, the respective control terminals d may be connected to a signal input terminal T1', as in the 15th embodiment (FIG. 39).

With this arrangement, a multiple-valued logic circuit of the 17th embodiment also obtains the characteristics shown in FIG. 33. Therefore, a multiple-valued logic operation using the linear sum of two inputs as a new input signal can be realized.

Figure 40:
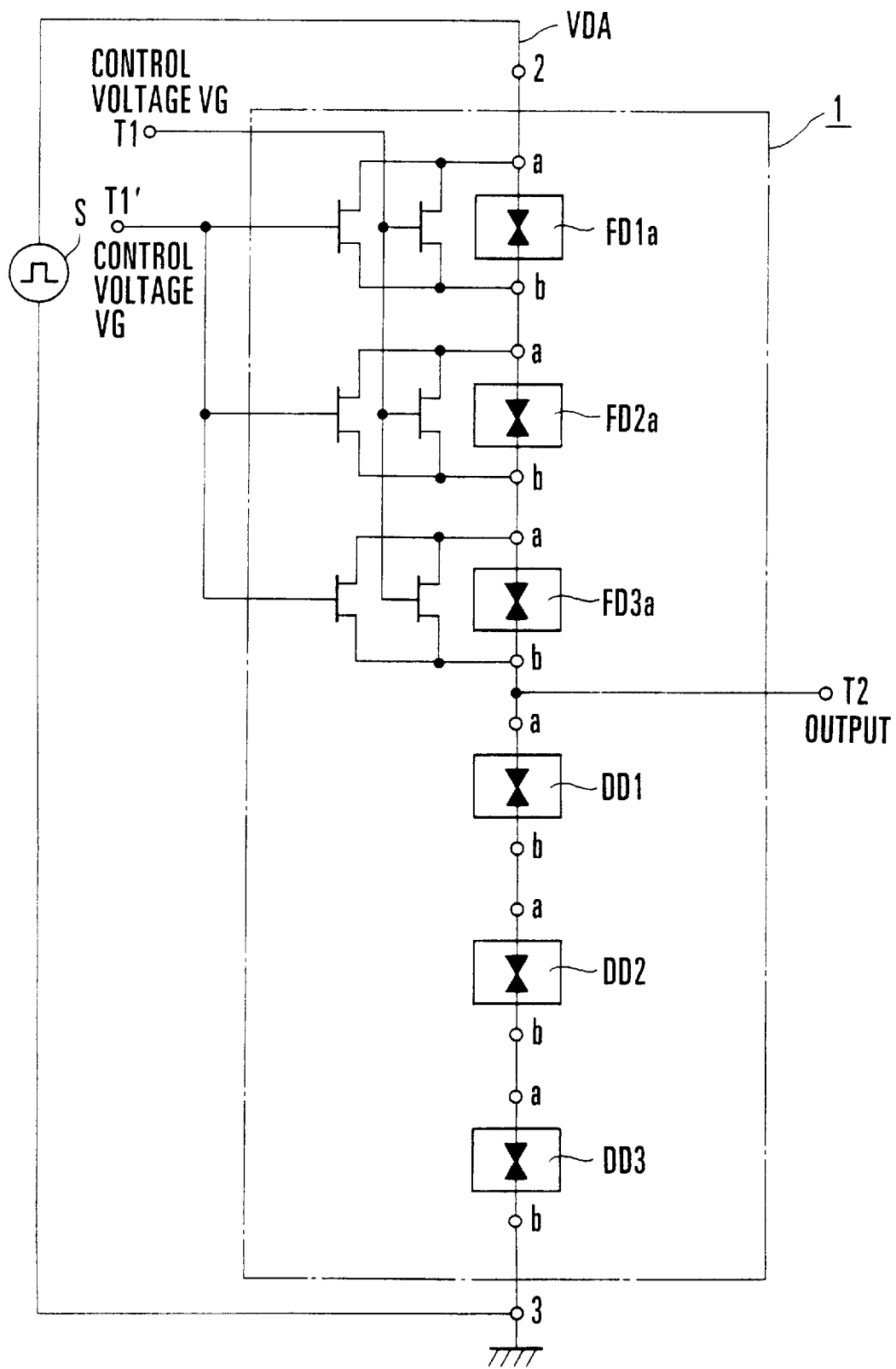
FIG. 40 is a circuit diagram showing another arrangement of the multiple-valued logic circuit of the 17th embodiment.

As in the 13th or 14th embodiment, this circuit can also has an arrangement as shown in FIG. 40 or 41.

18th Embodiment

FIG. 42 shows the arrangement of a multiple-valued logic circuit according to the 18th embodiment of the present invention, which is a modification of the eighth embodiment.

In the 18th embodiment, a transistor M' is connected in parallel to a series-connected structure of devices DD4 to DD6 in addition to a transistor M, as shown in FIG. 42. A signal input terminal T1' is connected to the gate of the transistor M'.

With this arrangement as well, a multiple-valued logic operation using the linear sum of two inputs as a new input signal can be realized, as described above.

A similar modification corresponding to the ninth embodiment shown in FIG. 21 can also be made to obtain an arrangement shown in FIG. 43.

19th Embodiment

FIG. 44 shows the arrangement of a multiple-valued logic circuit according to the 19th embodiment of the present invention.

Referring to FIG. 44, a transistor M" consists of an FET formed of a channel with an p-type conductivity and is connected in parallel to the series-connected portion of devices DD1 to DD3. A signal input terminal T1" is connected to the gate of the transistor M". The remaining reference numerals and symbols in FIG. 44 are the same as in FIG. 22.

Figure 45:
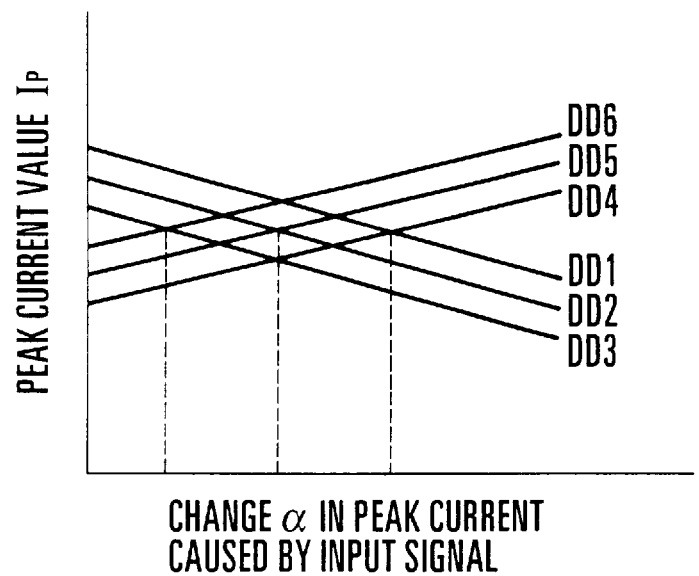
FIGS. 45A and 45B are graphs showing the function of the multiple-valued logic circuit of the 19th embodiment.
Figure 45:
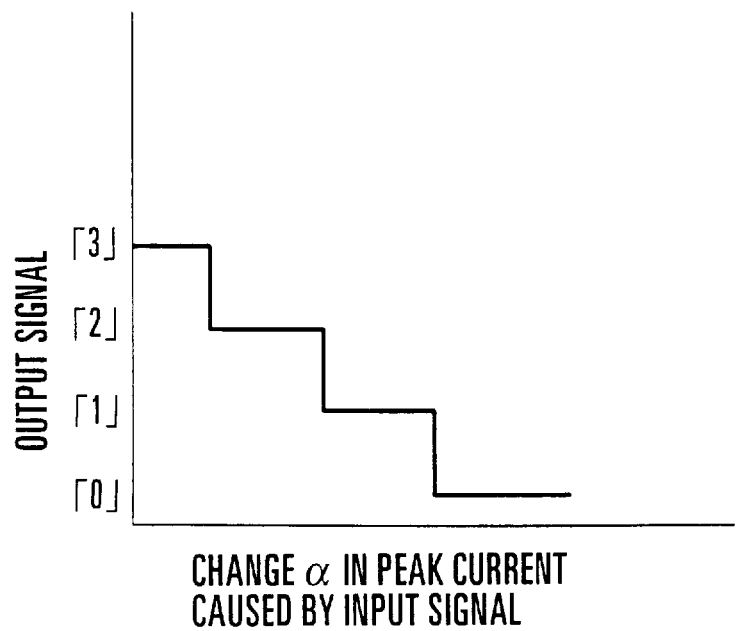
Figure 48:
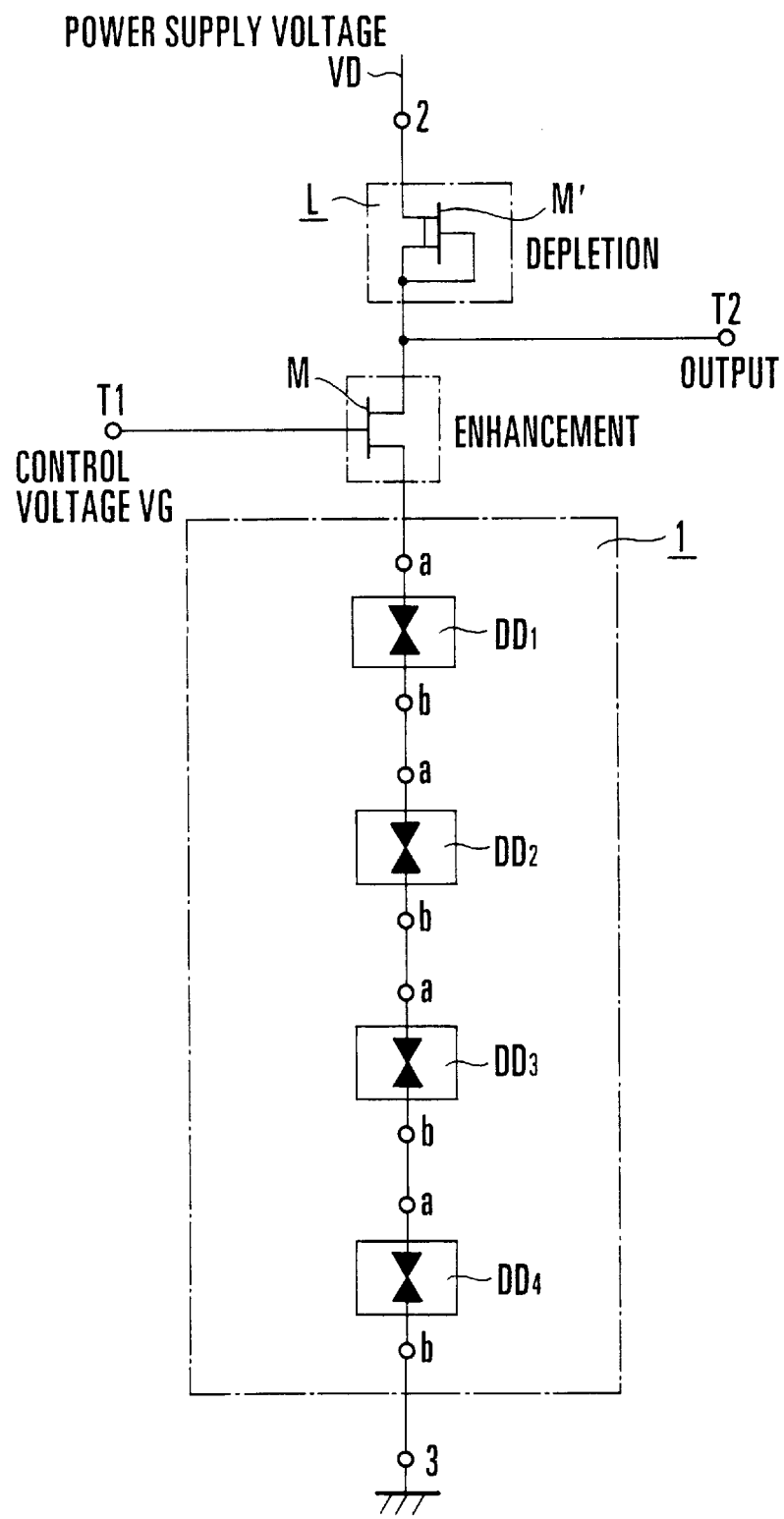
FIG. 48 is a circuit diagram showing the arrangement of a conventional multiple-valued logic circuit.

With this arrangement, the peak current values of the devices DD1 to DD6 change in accordance with an input signal, as shown in FIG. 45A. This change is topologically the same as in FIGS. 9A and 9B. The multiple-valued logic function matches that in FIG. 9B, as shown in FIG. 45A.

In the above embodiments, a resonant-tunneling diode is used as a device having negative differential resistance characteristics. However, the present invention is not limited to this, and an Esaki diode may be used.

In addition, a two-terminal device having effective negative differential resistance characteristics can be manufactured using a CMOS transistor (FIG. 46). Furthermore, a peak current can be controlled by using a CMOS transistor to arrange a control electrode (FIG. 47).

Referring to FIG. 46, reference numeral 101 denotes an n-channel depletion type CMOSFET; and 102, a p-channel depletion type CMOSFET. The output terminals of these devices are connected in series, and this series structure is connected between a high-voltage terminal (Vc) 103 and a low-voltage terminal. A gate 105 of the n-channel depletion type FET 101 is connected to a low-voltage terminal 104 side. A gate 108 of the p-channel depletion type FET 102 is connected to the high-voltage terminal 103. With this arrangement, the same operation as in the above-described two-terminal device having negative differential resistance characteristics can be obtained. The operation of the two-terminal device shown in FIG. 46 is described in detail in Japanese Patent Laid-Open No. 7-30130.

Referring to FIG. 47, a gate 105a of an n-channel depletion type FET 101a is connected to a control electrode (not shown). The remaining reference numerals in FIG. 47 are the same as in FIG. 46. With the arrangement shown in FIG. 47, the same operation as in the above-described three-terminal device having negative differential resistance characteristics can be obtained. The operation of the three-terminal device shown in FIG. 47 is described in detail in Japanese Patent Laid-Open No. 7-193255.

When the CMOS transistor shown in FIG. 46 or 47 is used, higher integration can be easily realized as compared to a circuit using a tunneling diode. Enhancement-type FETs are preferable to be used. But this does not exclude the use of depletion-type FETs.

As has been described above, according to the present invention, the first device, the second device connected in series with the first device, and the voltage source for applying an alternating current across the series circuit are arranged. The first device has the first and second main terminals and exhibits voltage-current characteristics including negative differential resistance characteristics for obtaining a peak current between the first and second main terminals. The second device is constituted by at least two series-connected unit devices each having first and second main terminals and exhibiting voltage-current characteristics including variable negative differential resistance characteristics for obtaining a peak current between the first and second main terminals.

As a result, according to the present invention, with a circuit arrangement using a small number of different kinds of devices, various multiple-valued logic functions can be realized, unlike in the prior art. One or two kinds of devices are necessary, and the total number of devices can also be decreased.

This facilitates optimal circuit design, so that the device density can be increased, and the operation speed of the device can be increased. In addition, the device can be easily manufactured.

Therefore, advantages of employment of multiple-valued logic, i.e., a decrease in area needed for interconnections or an increase in information processing speed by decreasing the number of logic steps can be expected, so that a high-performance integrated circuit can be realized.

What is claimed is:

1. A multiple-valued logic circuit comprising:
   a first device;
   a second device connected in series with said first device;
   a signal source for supplying an oscillating voltage across a series circuit consisting of said first device and said second device; and
   a signal output terminal,
wherein said first device is constituted by at least one unit device having first and second main terminals and exhibiting voltage-current characteristics including negative differential resistance characteristics for obtaining a peak current between said first and second main terminals, said second device is constituted by at least two series-connected unit devices each having first and second main terminals and exhibiting voltage-current characteristics including variable negative differential resistance characteristics for obtaining a peak current changing between said first and second main terminals, and said signal output terminal is connected to at least one of the contacts between said unit devices constituting said series circuit.

2. A circuit according to claim 1, wherein each of said unit devices constituting said second device has at least one signal input terminal for receiving a control signal for changing the peak current value between said first and second main terminals of said unit device.

3. A circuit according to claim 2, further comprising a common input terminal to which said signal input terminal of each of said unit devices is commonly connected.

4. A circuit according to claim 1, wherein each of said unit devices constituting said second device has a plurality of input terminals.

5. A circuit according to claim 4, wherein at least one of said plurality of input terminals of said unit device is connected to a common input terminal.

6. A circuit according to claim 1, wherein the number of unit devices constituting said first device is equal to that of unit devices constituting said second device.

7. A circuit according to claim 1, wherein the number of unit device constituting said first device is different from that of unit devices constituting said second device.

8. A circuit according to claim 7, wherein the number of unit devices constituting said first device is smaller than that of unit devices constituting said second device by one.

9. A circuit according to claim 1, wherein said signal output terminal is connected to a contact between said first device and said second device.

10. A circuit according to claim 1, wherein said signal output terminal is connected to a contact between said unit devices constituting said second device.

11. A circuit according to claim 1, wherein a plurality of signal output terminals are connected to contacts between predetermined devices constituting said series circuit.

12. A circuit according to claim 1, wherein said second device further comprises at least one control device for controlling the peak current values of all unit devices constituting said second device, and a signal input terminal connected to said control device to receive a control signal.

13. A circuit according to claim 12, wherein said control device is constituted by a plurality of three-terminal control devices each having one input terminal and two output terminals, said output terminals of said three-terminal control device being connected to two terminals of each of said unit devices constituting said second device, and said input terminal being connected to said signal input terminal.

14. A circuit according to claim 13, wherein said three-terminal control device is a field effect transistor.

15. A circuit according to claim 12, wherein said control device is constituted by a three-terminal control device having one input terminal and two output terminals, said output terminals of said three-terminal control device being connected to two terminals of a series structure of said series-connected unit devices constituting said second device, and said input terminal being connected to said signal input terminal.

16. A circuit according to claim 15, wherein said three-terminal control device is a field effect transistor.

17. A circuit according to claim 12, wherein said first device further comprises a set of three-terminal control devices for controlling the peak current values of all unit devices constituting said first device, and a signal input terminal connected to said set of three-terminal control devices to receive a control signal.

18. A circuit according to claim 1, wherein said second device further comprises at least two control devices for controlling the peak current values of all unit devices constituting said second device, and at least two signal input terminals respectively connected to said at least two control devices to receive a control signal.

19. A circuit according to claim 18, wherein said control device is constituted by a plurality of sets of at least two three-terminal control devices each having one input terminal and two output terminals, said output terminals of said three-terminal control device being connected to two terminals of each of said unit devices constituting said second device, one input terminal of each three-terminal control device of each set being commonly connected to said signal input terminal, and the other input terminal of each three-terminal control device of each set being connected to another signal input terminal.

20. A circuit according to claim 18, wherein said control device is constituted by at least two three-terminal control devices each having one input terminal and two output terminals, said output terminals of said at least two three-terminal control devices being commonly connected to two terminals of a series structure consisting of said series-connected unit devices constituting said second device, one input terminal of each of said at least two three-terminal control devices being commonly connected to said signal input terminal, and the other input terminal of each of said at least two three-terminal control devices being commonly connected to another signal input terminal.

21. A circuit according to claim 18, wherein said control device is a field effect transistor.

22. A circuit according to claim 1, wherein each of said unit devices constituting said second device consists of a four-terminal control device for controlling the peak current value with the variable negative differential resistance characteristics, and one input terminal of said four-terminal control device is commonly connected to a signal input terminal for receiving a control signal, and the other input terminals of said four-terminal control device are connected to different signal input terminals, respectively.

23. A circuit according to claim 1, wherein each of said unit devices constituting said second device consists of a four-terminal control device for controlling the peak current value having the variable negative differential resistance characteristics, and input terminals of said four-terminal control devices are commonly connected to signal input terminals for receiving a control signal.

24. A circuit according to claim 23, wherein the number of unit devices constituting said first device is equal to that of unit devices constituting said second device.

25. A circuit according to claim 1, wherein each of said unit devices constituting said first and second devices is a device using a resonant-tunneling effect.

26. A circuit according to claim 1, wherein each of said unit devices constituting said first and second devices is a device using a CMOS transistor.

* * * * *